(12) United States Patent
Luo et al.

(10) Patent No.: US 12,189,160 B2
(45) Date of Patent: Jan. 7, 2025

(54) DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yonghui Luo, Beijing (CN); Binfeng Feng, Beijing (CN); Jiaxiang Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 879 days.

(21) Appl. No.: 17/311,332

(22) PCT Filed: Sep. 9, 2020

(86) PCT No.: PCT/CN2020/114247
§ 371 (c)(1),
(2) Date: Jun. 6, 2021

(87) PCT Pub. No.: WO2022/051943
PCT Pub. Date: Mar. 17, 2022

(65) Prior Publication Data
US 2022/0317355 A1 Oct. 6, 2022

(51) Int. Cl.
*G02B 5/30* (2006.01)
*G02B 1/14* (2015.01)
*G06F 1/16* (2006.01)

(52) U.S. Cl.
CPC .............. *G02B 5/3033* (2013.01); *G02B 1/14* (2015.01); *G06F 1/1652* (2013.01); *G06F 1/1656* (2013.01)

(58) Field of Classification Search
CPC ........ G02B 5/3033; G02B 1/14; G06F 1/1652
See application file for complete search history.

(56) References Cited

U.S. PATENT DOCUMENTS

2005/0073623 A1* 4/2005 Tsuo ............... G06F 1/1637
349/58
2015/0131237 A1* 5/2015 Chen ............... H10K 50/84
361/728
(Continued)

FOREIGN PATENT DOCUMENTS

CN 107968112 A 4/2018
CN 108054189 A 5/2018
(Continued)

OTHER PUBLICATIONS

The Extended European Search Report in the European Patent Application No. 20952731.6, dated May 24, 2021.
(Continued)

*Primary Examiner* — Lucy P Chien
(74) *Attorney, Agent, or Firm* — Intellectual Valley Law, P.C.

(57) ABSTRACT

A display apparatus is provided. The display apparatus includes a display panel having a display portion, a connecting portion, and a bending portion; a polarizer on a first side of the display portion; a cover window on the first side of the display portion, and on a side of the polarizer away from the display portion; a coating layer having a main portion, and a tapered portion extending from the main portion toward the polarizer; and an optically clear adhesive layer on the first side of the display portion, and between the polarizer and the cover window. The optically clear adhesive layer has a first adhering surface at least partially attaching to the cover window, a second adhering surface at least partially attaching to the polarizer, and an edge connecting the first adhering surface and the second adhering surface and adjacent to the tapered portion.

19 Claims, 23 Drawing Sheets

(56) References Cited

U.S. PATENT DOCUMENTS

| | | |
|---|---|---|
| 2016/0174304 A1 | 6/2016 | Kim et al. |
| 2017/0047547 A1 | 2/2017 | Son et al. |
| 2017/0148859 A1 | 5/2017 | Nishinohara |
| 2018/0097199 A1 | 4/2018 | Jo et al. |
| 2018/0213902 A1 | 8/2018 | Lim |
| 2018/0337224 A1 | 11/2018 | Aoki |
| 2022/0384746 A1 | 12/2022 | Wang et al. |

FOREIGN PATENT DOCUMENTS

| | | |
|---|---|---|
| CN | 108417730 A | 8/2018 |
| CN | 108831908 A | 11/2018 |
| CN | 109542270 A | 3/2019 |
| CN | 109873020 A | 6/2019 |
| CN | 110048012 A | 7/2019 |
| CN | 110277435 A | 9/2019 |
| CN | 110491883 A | 11/2019 |
| CN | 110515499 A | 11/2019 |
| CN | 110840038 A | 2/2020 |
| CN | 111599272 A | 8/2020 |
| JP | 2001005404 A | 1/2001 |

OTHER PUBLICATIONS

International Search Report & Written Opinion mailed May 26, 2021, regarding PCT/CN2020/114247.

Chinese Search Report & Written Opinion completed Jun. 10, 2020, regarding X1905689B7.

\* cited by examiner

DISPLAY APPARATUS

CROSS-REFERENCE TO RELATED APPLICATION

This application is a national stage application under 35 U.S.C. § 371 of International Application No. PCT/CN2020/114247, filed Sep. 9, 2020, the contents of which are incorporated by reference in the entirety.

TECHNICAL FIELD

The present invention relates to display technology, more particularly, to a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a display apparatus, comprising a display panel comprising a display portion, a connecting portion, and a bending portion; a polarizer on a first side of the display portion; a cover window on the first side of the display portion, and on a side of the polarizer away from the display portion; a coating layer comprising a main portion, and a tapered portion extending from the main portion toward the polarizer; wherein the bending portion connects the display portion and the connecting portion, the bending portion is bent so that the connecting portion is facing a second side of the display portion, forming a bending cavity that is surrounded by the bending portion, the second side being opposite to the first side, the coating layer covers a back side of the bending portion opposite to a side directly surrounding the bending cavity; and an optically clear adhesive layer on the first side of the display portion, and between the polarizer and the cover window, the optically clear adhesive layer attaching the cover window to the polarizer, wherein the optically clear adhesive layer has a first adhering surface at least partially attaching to the cover window, a second adhering surface at least partially attaching to the polarizer, and an edge connecting the first adhering surface and the second adhering surface and adjacent to the tapered portion; wherein an orthographic projection of an edge of the tapered portion adjacent to the polarizer on a plane comprising a main surface of the display portion is between an orthographic projection of an edge of the cover window on the plane comprising the main surface of the display portion and an orthographic projection of an edge of the polarizer on the plane comprising the main surface of the display portion; and an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion, or is between the orthographic projection of the edge of the polarizer adjacent to the tapered portion on the plane comprising the main surface of the display portion and the orthographic projection of the edge of the cover window adjacent to the tapered portion on the plane comprising the main surface of the display portion.

Optionally, a height of the tapered portion, relative to the main surface of the display portion on the first side, gradually increases from an edge of the tapered portion adjacent to the polarizer to a boundary between the tapered portion and the main portion; a first shortest distance between an orthographic projection of an edge of the polarizer adjacent to the tapered portion on the plane comprising the main surface of the display portion and the orthographic projection of the edge of the tapered portion adjacent to the polarizer on the plane comprising the main surface of the display portion is equal to or greater than a first value.

Optionally, a fourth shortest distance between the orthographic projection of the edge connecting the first adhering surface and the second adhering surface on the plane comprising the main surface of the display portion and the orthographic projection of the edge of the cover window adjacent to the tapered portion on the plane comprising the main surface of the display portion is equal to or greater than a second value.

Optionally, a height of the tapered portion, relative to the main surface of the display portion on the first side, gradually increases from an edge of the tapered portion adjacent to the polarizer to a boundary between the tapered portion and the main portion; and the orthographic projection of the edge of the cover window on the plane comprising the main surface of the display portion is between the orthographic projection of the edge of the tapered portion adjacent to the polarizer on the plane comprising the main surface of the display portion and an orthographic projection of the boundary between the tapered portion and the main portion on the plane comprising the main surface of the display portion.

Optionally, a second shortest distance between an orthographic projection of an edge of the cover window adjacent to the tapered portion on the plane comprising the main surface of the display portion and the orthographic projection of a boundary between the tapered portion and the main portion on the plane comprising the main surface of the display portion is also equal to or greater than a first value.

Optionally, an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion.

Optionally, a third shortest distance, between an orthographic projection of the edge connecting the first adhering surface and the second adhering surface on the plane comprising the main surface of the display portion and an orthographic projection of a virtual contour line on the plane comprising the main surface of the display portion, is also equal to or greater than the first value; the virtual contour line is on a surface of the tapered portion; and a height of the virtual contour line, relative to the main surface of the display portion on the first side, equals to a height of the second adhering surface, relative to the main surface of the display portion on the first side.

Optionally, the second value is equal to a bonding tolerance of the optically clear adhesive layer.

Optionally, the second value is in a range of 100 μm to 200 μm.

Optionally, the first value is equal to an engineering tolerance of the tapered portion.

Optionally, the first value is in a range of 150 μm to 250 μm.

Optionally, the display apparatus further comprises a bezel covering the coating layer and on a side of the coating layer away from the bending portion, the bezel connected to the cover window.

Optionally, the display apparatus further comprises a first back film covering a back surface of the display portion on the second side; wherein the display portion has a display region in which an image is displayed and a fanout region between the display region and the bending portion, the display portion comprising a plurality of signal lines extending through the fanout region; and an orthographic projection of an edge of the first back film adjacent to the bending portion on the plane comprising the main surface of the display portion is between an orthographic projection of a boundary between the fanout region and the bending portion on the plane comprising the main surface of the display portion and an orthographic projection of a bending line, along which the bending portion is bent, on the plane comprising the main surface of the display portion.

Optionally, a fifth shortest distance between the orthographic projection of the edge of the first back film adjacent to the bending portion on the plane comprising the main surface of the display portion and the orthographic projection of the bending line on the plane comprising the main surface of the display portion is equal to or greater than a third value equals to $\sqrt{a^2+b^2}$; a is a bonding tolerance of the first back film; and b is a bending tolerance of the bending portion.

Optionally, the third value is in a range of 100 μm to 200 μm.

Optionally, a sixth shortest distance between the orthographic projection of the edge of the first back film adjacent to the bending portion on the plane comprising the main surface of the display portion and the orthographic projection of the boundary between the fanout region and the bending portion on the plane comprising the main surface of the display portion is equal to or greater than a fourth value which is a composite tolerance calculated based on a bonding tolerance of the first back film and a material tolerance of the first back film.

Optionally, the fourth value is in a range of 100 μm to 200 μm.

Optionally, a seventh shortest distance between the orthographic projection of the edge of the first back film adjacent to the bending portion on the plane comprising the main surface of the display portion and the orthographic projection of the edge of the tapered portion adjacent to the polarizer on the plane comprising the main surface of the display portion is equal to or greater than a fifth value which is a sum of a flow tolerance of the coating layer, the bonding tolerance of the first back film, and an overlength of a neutral plane of a structure comprising the bending portion and the coating layer.

Optionally, the fifth value is in a range of 300 μm to 500 μm.

Optionally, a distance between the orthographic projection of an edge of the tapered portion adjacent, to the polarizer on the plane comprising the main surface of the display portion and the orthographic projection of the boundary between the tapered portion and the main portion on the plane comprising the main surface of the display portion is less than 400 μm.

Optionally, the coating layer covering the back side of the bending portion extends onto the first side of the display portion by a first margin, and extends onto a side of the connecting portion opposite to the display portion by a second margin; and the first margin and the second margin are respectively in a range of 150 μm to 250 μm.

Optionally, the connecting portion and the display portion are parts of a stacked structure in the display apparatus; wherein, on the first side of the display portion, the stacked structure comprises one or more of a polarizer on the display portion; an optically clear adhesive layer on a side of the polarizer away from the display portion; and a cover window on a side of the optically clear adhesive layer away from the polarizer, wherein the optically clear adhesive layer attaches the cover window to the polarizer; wherein, on a second side of the display portion, the stacked structure comprises one or more of a first back film on a back surface of the display portion on the second side; a support layer on a side of the first back film away from the display portion; a metal plate on a side of the support layer away from the first back film; a second back film on a side of the metal plate away from the support layer; and the connecting portion on a side of the second back film away from the metal plate.

Optionally, an orthographic projection of an edge of the support layer on the display portion substantially overlaps with an orthographic projection of an edge of the first back film on the display portion; and an orthographic projection of the support layer on the display portion covers an orthographic projection of the metal plate on the display portion with a margin.

Optionally, the display apparatus further comprises a second optically clear adhesive layer between the first back film and the support layer, the second optically clear adhesive layer adhering the first back film and the support layer together; and an adhesive layer between the metal plate and the second back film, the adhesive layer adhering the metal plate and the second back film together.

Optionally, the display apparatus further comprises an adhesive layer between the metal plate and the second back film, the adhesive layer adhering the metal plate and the second back film together; an ultra thin glass on a side of the cover window away from the display portion; a second optically clear adhesive layer between the ultra thin glass and the cover window, the second optically clear adhesive layer adhering the ultra thin glass and the cover window together; a second cover window on a side of the ultra thin glass away from the cover window; and a third optically clear adhesive layer between the ultra thin glass and the second cover window, the third optically clear adhesive layer adhering the ultra thin glass and the second cover window together.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
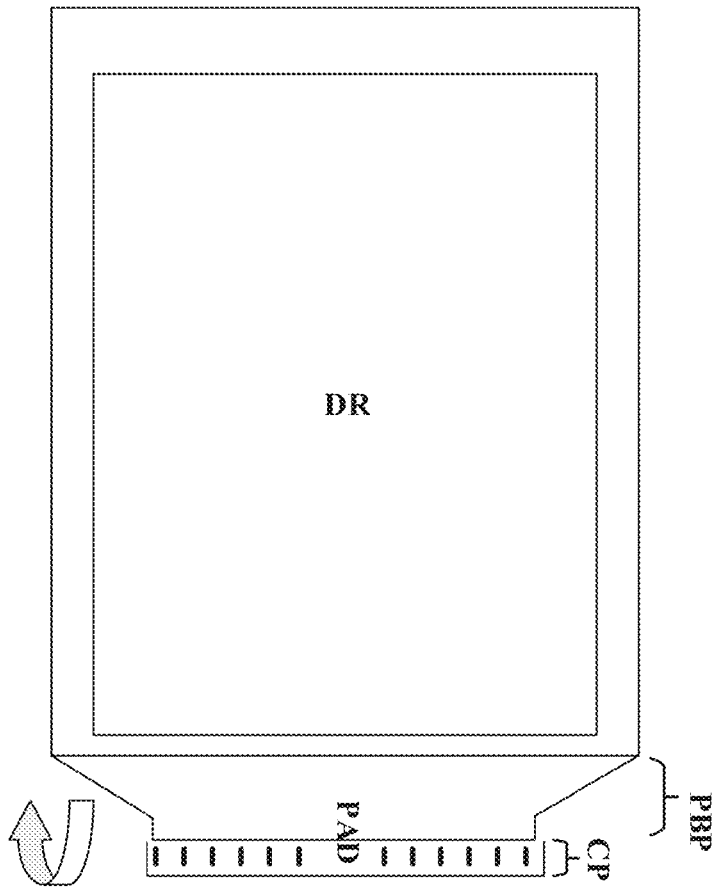
FIG. 1 is a schematic diagram of a display apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display apparatus that substantially obviate one or more of the problems due to limitations and disadvantages of the related art. In one aspect, the present disclosure provides a display apparatus. In some embodiments, the display apparatus includes a display panel comprising a display portion, a connecting portion, and a bending portion, the bending portion connecting the display portion and the connecting portion, wherein the bending portion is bent so that the connecting portion is facing a second side of the display portion, forming a bending cavity that is surrounded by the bending portion, the second side being opposite to the first side; a polarizer on a first side of the display portion; a cover window on the first side of the display portion, and on a side of the polarizer away from the display portion; a coating layer covering a back side of the bending portion opposite to a side directly surrounding the bending cavity; and an optically clear adhesive layer on the first side of the display portion, and between the polarizer and the cover window, the optically clear adhesive layer attaching the cover window to the polarizer, wherein the optically clear adhesive layer has a first adhering surface at least partially attaching to the cover window, a second adhering surface at least partially attaching to the polarizer, and an edge connecting the first adhering surface and the second adhering surface and adjacent to the tapered portion. Optionally, the coating layer has a main portion and a tapered portion extending from the main portion toward the polarizer. Optionally, a height of the tapered portion, relative to a main surface of the display portion on the first side, gradually increases from an edge of the tapered portion adjacent to the polarizer to a boundary between the tapered portion and the main portion. Optionally, an orthographic projection of an edge of the cover window on a plane comprising the main surface of the display portion is between an orthographic projection of the edge of the tapered portion adjacent to the polarizer on the plane comprising the main surface of the display portion and an orthographic projection of the boundary between the tapered portion and the main portion on the plane comprising the main surface of the display portion. Optionally, the orthographic projection of the edge of the tapered portion adjacent to the polarizer on the plane comprising the main surface of the display portion is between the orthographic projection of the edge of the cover window on the plane comprising the main surface of the display portion and an orthographic projection of an edge of the polarizer on the plane comprising the main surface of the display portion. Optionally, an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion, or is between the orthographic projection of the edge of the polarizer adjacent to the tapered portion on the plane comprising the main surface of the display portion and the orthographic projection of the edge of the cover window adjacent to the tapered portion on the plane comprising the main surface of the display portion.

Optionally, a first shortest distance between an orthographic projection of an edge of the polarizer adjacent to the tapered portion on the plane comprising the main surface of the display portion and the orthographic projection of the edge of the tapered portion adjacent to the polarizer on the plane comprising the main surface of the display portion is equal to or greater than a first value. Optionally, a second shortest distance between an orthographic projection of an edge of the cover window adjacent to the tapered portion on the plane comprising the main surface of the display portion and the orthographic projection of the boundary between the tapered portion and the main portion on the plane comprising the main surface of the display portion is also equal to or greater than the first value.

FIG. 1 is a schematic diagram of a display apparatus in some embodiments according to the present disclosure. Referring to FIG. 1, the display apparatus includes a display panel having a display portion in a display region DR where an image is displayed by an array of subpixels in the display portion. A peripheral region of the display apparatus surrounds the display region DR. Although a rectangular display region is shown in FIG. 1, the display region DR may have any appropriate shapes and dimensions. Examples of appropriate shapes of the display region DR include a circular shape, a square shape, a hexagonal shape, an elliptical shape, and an irregular polygon shape. Each suhpixel in the display region DR may be electrically connected to a pixel driving circuit, which includes one or more thin film transistors. The display apparatus further includes gate lines and data lines for providing signals for driving image display in the display region DR. These signal lines are electrically connected to one or more integrated circuits such as gate driving integrated circuit and data driving integrated circuit. The one or more integrated circuits may be integrated into the display panel (chip-on-glass) or mounted on a flexible printed circuit (chip-on-film). The one or more integrated circuits are electrically connected to the flexible printed circuit. The display apparatus further includes various other signal lines such as a high voltage supply line VDD, a low voltage supply line VSS, and an initiation signal line.

Figure 2:
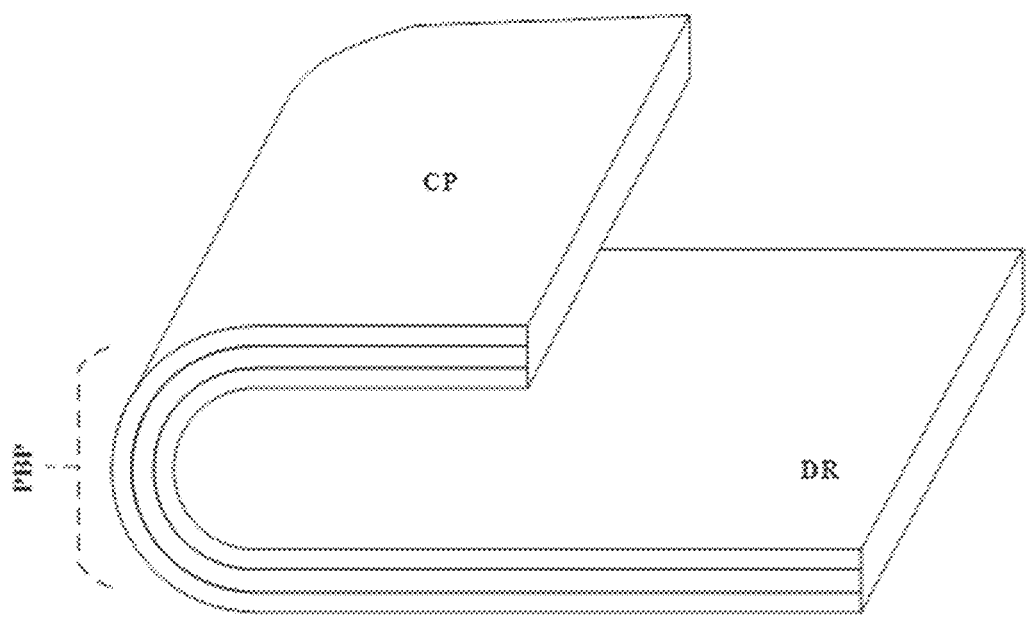
FIG. 2 is a schematic diagram of a display apparatus in some embodiments according to the present disclosure.

The display apparatus further includes a bending portion PBP and a connecting portion CP. The connecting portion CP is a portion where a flexible printed circuit can be bonded to the display apparatus. The bending portion PBP is flexible or bendable. As shown in FIG. 1, the bending portion PBP may be bent along the direction of an arrow depicted in FIG. 1 so that the connecting portion CP can be bent toward a back side of the display portion. FIG. 2 is a schematic diagram of a display apparatus in some embodiments according to the present disclosure. FIG. 2 depicts a display apparatus in which the bending portion PBP is bent, and the connecting portion CP is bent toward the back side of the display portion.

Figure 3:
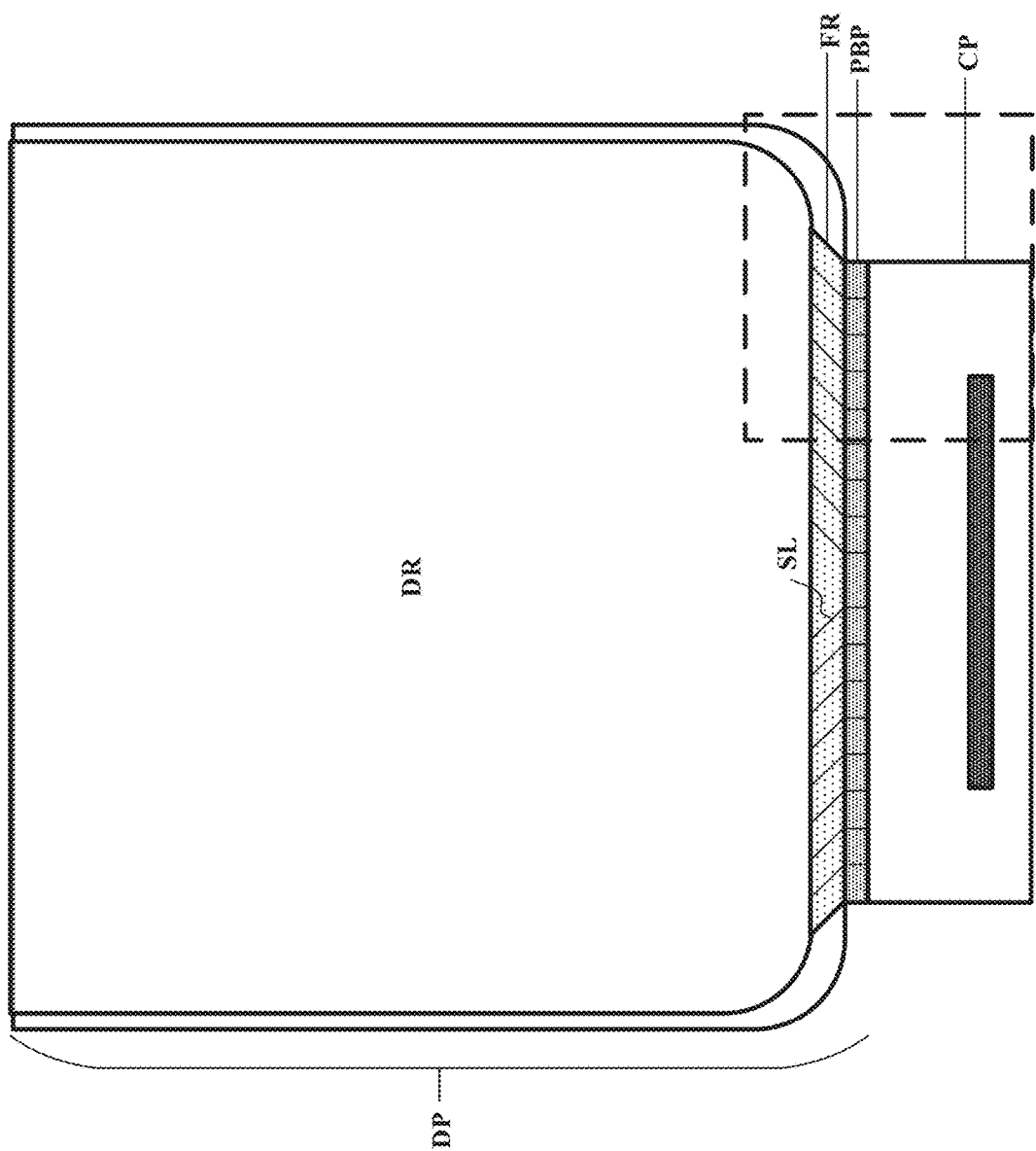
FIG. 3 is a plan view of a display apparatus in some embodiments according to the present disclosure.

FIG. 3 is a plan view of a display apparatus in some embodiments according to the present disclosure. Referring to FIG. 3, the display portion DP in some embodiments is in a display region DR in which an image is displayed and a fanout region FR between the display region DR and the bending portion PBP, the display portion DP including a plurality of signal lines SL extending through the fanout region FR.

As used herein, the term "display region" refers to a region of a display panel in a display apparatus where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent, subpixel regions in a same pixel. Optionally, the inter-subpixel region is a region between two adjacent subpixel regions from two adjacent pixels. Optionally, the display apparatus is a flexible display apparatus.

Figure 4A:
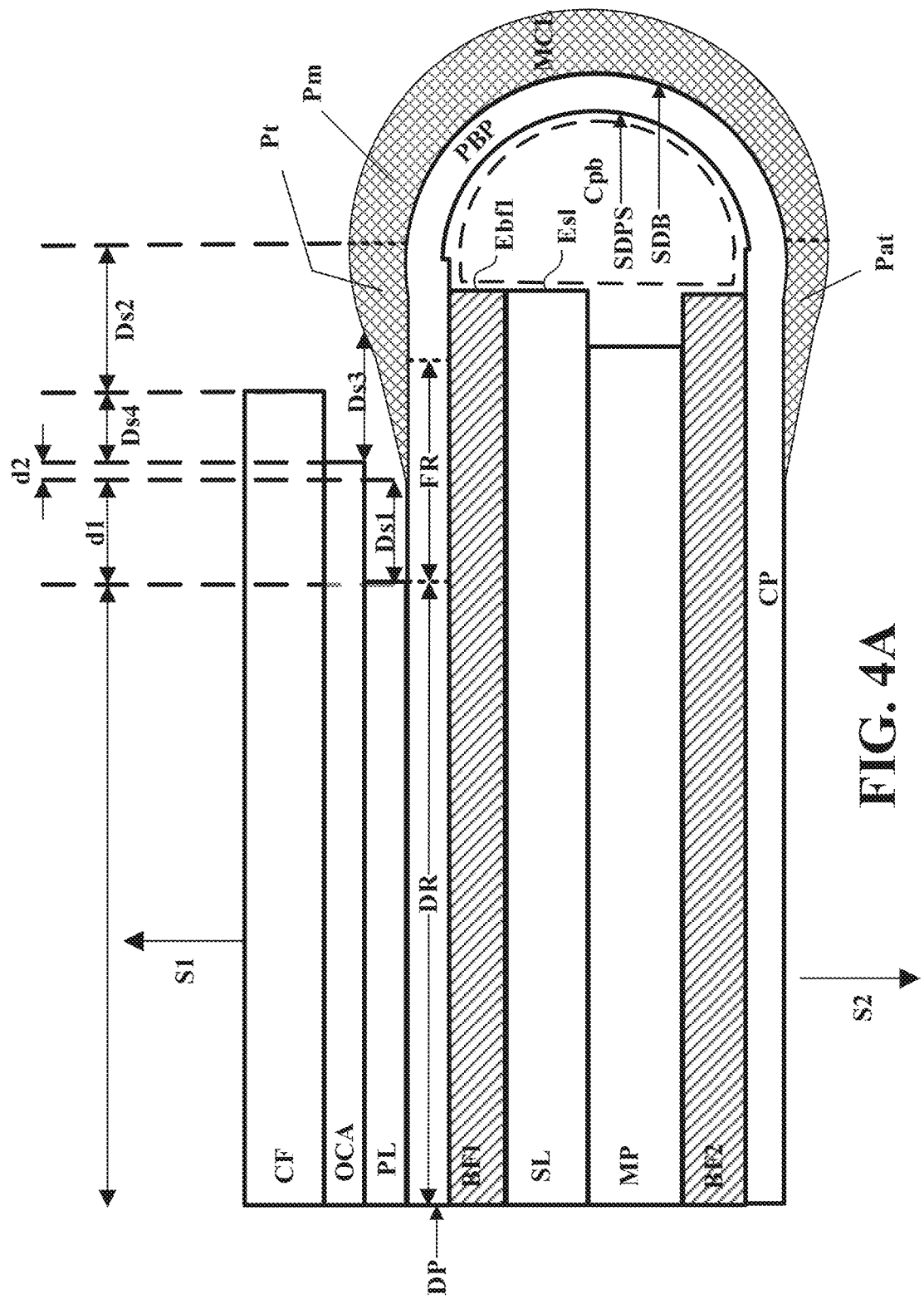
FIG. 4A is a cross-sectional view around a bending portion of a display apparatus in some embodiments according to the present disclosure.

FIG. 4A is a cross-sectional view around a bending portion of a display apparatus in some embodiments according to the present disclosure. Referring to FIG. 4A, in some embodiments, the display apparatus includes a display portion DP; a polarizer PL on a first side S1 of the display portion DP; a cover window CF on the first side S1 of the display portion DP, and on a side of the polarizer PL away from the display portion DP; a connecting portion CP; a bending portion PBP connecting the display portion DP and the connecting portion CP. The bending portion PBP is bent so that the connecting portion CP is facing a second side S2 of the display portion DP, forming a bending cavity Cpb that is surrounded by the bending portion PBP, As shown in FIG. 4A, the second side S2 is opposite to the first side S1.

In some embodiment, the display apparatus further includes a coating layer MCL covering a back side SDB of the bending portion PBP opposite to a side SDPS directly surrounding the bending cavity Cpb. In one example, the back side SDB of the bending portion PBP is a side of the bending portion PBP that is in direct contact with the coating layer MCL, and the side SDPS directly surrounding the bending cavity Cpb is a side of the bending portion PBP that is not in contact with the coating layer MCL. The coating layer MCL includes a main portion Pm, and a tapered portion Pt extending from the main portion Pm toward the polarizer PL. For example, the tapered portion Pt extends from the main portion Pm onto the first side S1 of the display portion DP, an edge of the tapered portion Pt adjacent to the polarizer PL is spaced apart from the polarizer PL. In one example, the tapered portion Pt covers a portion of the fanout region FR in the display portion DP.

In some embodiments, the coating layer MCL further includes an additional tapered portion Pat, extending from the main portion Pm onto a side of the connecting portion CP opposite to the display portion DP.

Figure 4B:
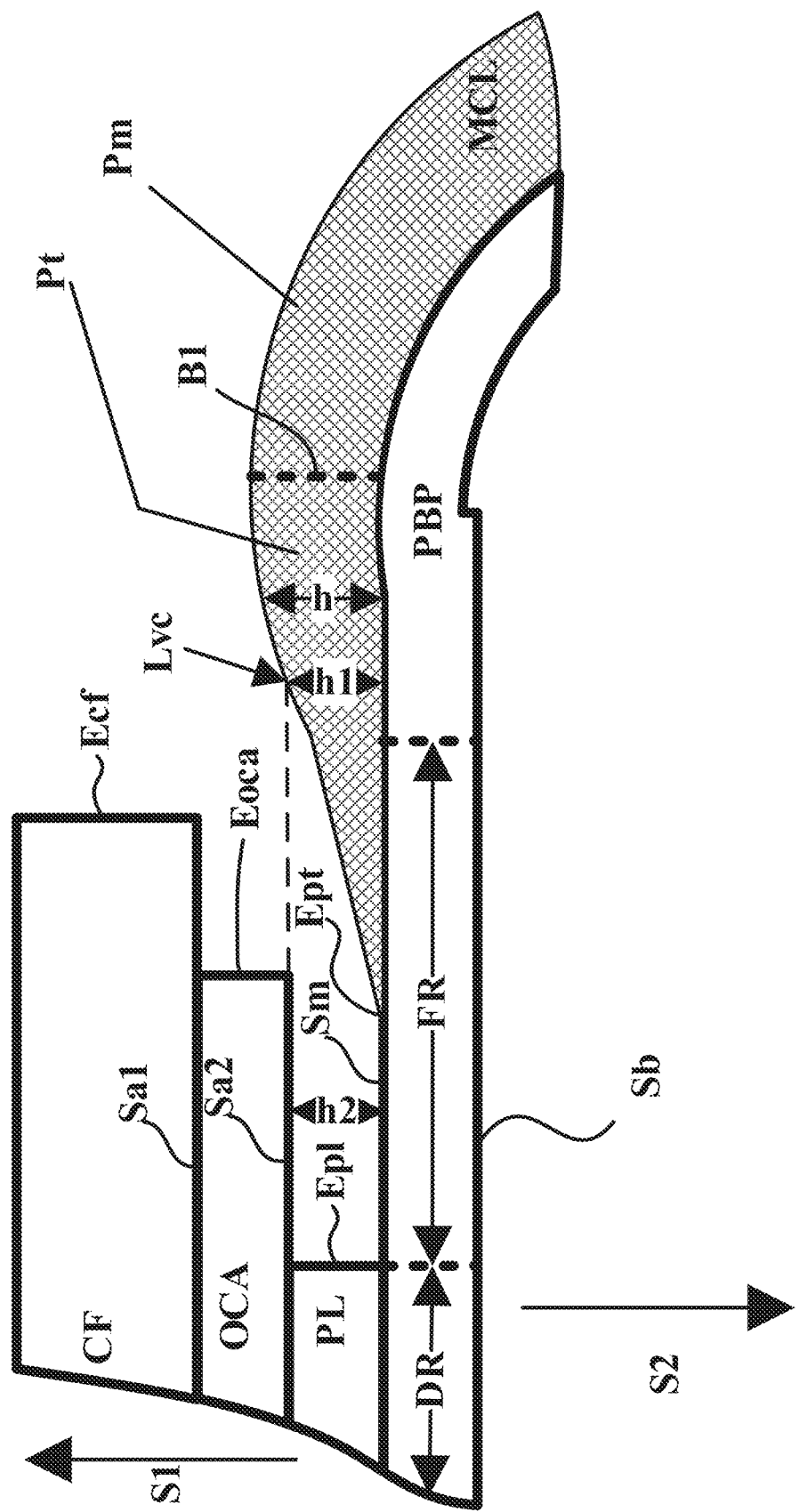
FIG. 4B is a partial view around a tapered portion of a coating layer in a display apparatus in some embodiments according to the present disclosure.
Figure 4C:
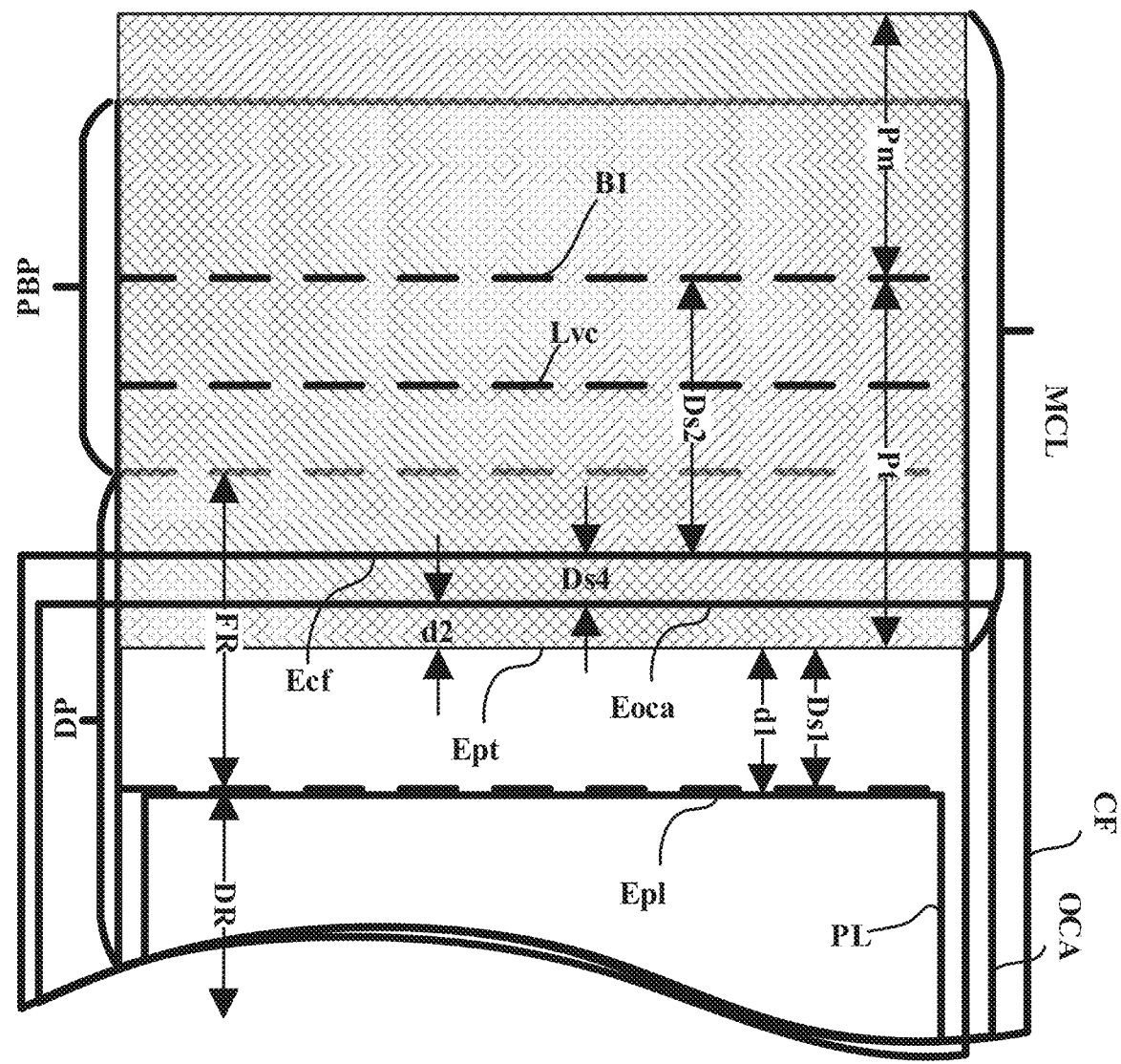
FIG. 4C is a partial plan view around a tapered portion of a coating layer in a display apparatus in some embodiments according to the present disclosure.

FIG. 4B is a partial view around a tapered portion of a coating layer in a display apparatus in some embodiments according to the present disclosure. FIG. 4C is a partial plan view around a tapered portion of a coating layer in a display apparatus in some embodiments according to the present disclosure. Referring to FIG. 4B and FIG. 4C, in some embodiments, a height h of the tapered portion Pt, relative to a main surface Sm of the display portion DP on the first side S1, gradually increases from an edge Ept of the tapered portion Pt adjacent to the polarizer PL to a boundary B1 between the tapered portion Pt and the main portion Pm. Optionally, the boundary B1 is a boundary at which the tapered portion Pt has a maximum height relative to the main surface Sm of the display portion DP on the first side S1. Optionally, the boundary B1 is a boundary that is co-planar with an edge of the first back film BF1 proximal to the bending cavity Cpb.

Referring to FIG. 4A to FIG. 4C, in some embodiments, an orthographic projection of the cover window CF on the plane comprising the main surface Sm of the display portion DP is between an orthographic projection of the edge Ept of the tapered portion Pt adjacent to the polarizer PL on the plane comprising the main surface Sm of the display portion DP and an orthographic projection of the boundary B1 between the tapered portion Pt and the main portion Pm on the plane comprising the main surface Sm of the display portion DP. Optionally, a first shortest distance Ds1 between an orthographic projection of an edge Ep1 of the polarizer PL adjacent to the tapered portion Pt on the plane comprising the main surface Sm of the display portion DP and the orthographic projection of the edge Ept of the tapered portion Pt adjacent to the polarizer PL on the plane comprising the main surface Sm of the display portion DP is equal to or greater than a first value. Optionally, a second shortest distance Ds2 between an orthographic projection of an edge Ecf of the cover window adjacent to the tapered portion Pt on the plane comprising the main surface Sm of the display portion DP and the orthographic projection of the boundary B1 between the tapered portion Pt and the main portion Pm on the plane comprising the main surface Sm of the display portion DP is also equal to or greater than the first value.

Optionally, the first value is equal to an engineering tolerance of the tapered portion Pt. Optionally, the engineering tolerance of the tapered portion Pt is in a range of 150 μm to 250 μm, e.g., 150 μm to 175 μm, 175 μm to 200 μm, 200 μm to 225 μm, or 225 μm to 250 μm. Optionally, the first value is in a range of 150 μm to 250 μm, e.g., 150 μm to 175 μm, 175 μm to 200 μm, 200 μm to 225 μm, or 225 μm to 250 μm. Optionally, the engineering tolerance of the tapered portion Pt is 200 μm. Optionally, the first value is 200 μm. Optionally, the first shortest distance Ds1 is equal to or greater than 200 μm. Optionally, the second shortest distance Ds2 is equal to or greater than 200 μm. As used herein, the term "engineering tolerance" refers to a tolerance for an error or a range of error in forming a part of the display apparatus such as the tapered portion Pt.

In some embodiments, the display apparatus further includes an optically clear adhesive layer OCA on the first side S1 of the display portion DP. The optically clear adhesive layer OCA is between the polarizer PL and the cover window CF. The optically clear adhesive layer OCA attaches the cover window SF to the polarizer PL. Referring to FIG. 4B, the optically clear adhesive layer in some embodiments has a first adhering surface Sa1 at least partially attaching to the cover window SF, a second adhering surface Sa2 at least partially attaching to the polarizer PL, and an edge Eoca connecting the first adhering surface Sa1 and the second adhering surface Sa2. The edge Eoca is adjacent to the tapered portion Pt. Referring to FIG. 4A to FIG. 4C, an orthographic projection of the edge Eoca connecting the first adhering surface Sa1 and the second adhering surface Sa2 on the plane comprising the main surface Sm of the display portion DP is between the orthographic projection of the edge Ep1 of the polarizer PL adjacent to the tapered portion Pt on the plane comprising the main surface Sm of the display portion DP and the orthographic projection of the edge Ecf of the cover window CF adjacent to the tapered portion Pt on the plane comprising the main surface Sm of the display portion DP.

Optionally, the orthographic projection of the edge Eoca connecting the first adhering surface Sa1 and the second adhering surface Sa2 on the plane comprising the main surface Sm of the display portion DP is between an orthographic projection of the edge Ept of the tapered portion Pt adjacent to the polarizer PL on the plane comprising the main surface Sm of the display portion DP and an orthographic projection of the boundary B1 between the tapered portion Pt and the main portion Pm on the plane comprising the main surface Sm of the display portion DP.

In some embodiments, a third shortest distance Ds3, between the orthographic projection of the edge Eoca connecting the first adhering surface Sa1 and the second adhering surface Sa2 on the plane comprising the main surface Sm of the display portion DP and an orthographic projection of a virtual contour line Lvc on a surface of the tapered portion Pt on the plane comprising the main surface Sm of the display portion DP, is also equal to or greater than the first value. Referring to FIG. 4B, the virtual contour line Lvc in some embodiments is defined as follows: a height h1 of the virtual contour line Lvc, relative to the main surface Sm of the display portion DP on the first side S1, equals to a height h2 of the second adhering surface Sa2, relative to the main surface Sm of the display portion DP on the first side S1.

Optionally, the first value is equal to an engineering tolerance of the tapered portion Pt. Optionally, the engineering tolerance of the tapered portion Pt is in a range of 150 μm to 250 μm, e.g., 150 μm to 175 μm, 175 μm to 200 μm, 200 μm to 2.25 μm, or 225 μm to 250 μm. Optionally, the first value is in a range of 150 μm to 250 μm, e.g., 150 μm to 175 μm, 175 μm to 200 μm, 200 μm to 225 μm, or 225 μm to 250 μm. Optionally, the engineering tolerance of the tapered portion Pt is 200 μm. Optionally, the first value is 200 μm. Optionally, the third shortest distance Ds3 is equal to or greater than 200 μm.

In some embodiments, a fourth shortest distance Ds4 between the orthographic projection of the edge Eoca connecting the first adhering surface Sa1 and the second adhering surface Sa2 on the plane comprising the main surface Sm of the display portion DP and the orthographic projection of the edge Ed of the cover window CF adjacent to the tapered portion Pt on the plane comprising the main surface Sm of the display portion DP is equal to or greater than a second value.

Optionally, the second value is equal to a bonding tolerance of the optically clear adhesive layer OCA. Optionally, the bonding tolerance of the optically clear adhesive layer is in a range of 100 μm to 200 μm, e.g., 100 μm to 125 μm, 125 μm to 150 μm, 150 μm to 175 μm, or 175 μm to 200 μm. Optionally, the second value is in a range of 100 μm to 200 μm, e.g., 100 μm to 125 μm, 125 μm to 150 μm, 150 μm to 175 μm, or 175 μm to 200 μm. Optionally, the bonding tolerance of the optically clear adhesive layer OCA is 150 μm. Optionally, the second value is 150 μm. Optionally, the fourth shortest distance Ds4 is equal to or greater than 150 μm. As used herein, the term "bonding tolerance" refers to a tolerance for an error or a range of error in bonding two parts of the display apparatus, for example, in bonding the optically clear adhesive layer OCA, e.g., to the cover window CF or to the polarizer PL. The error may be due to an alignment error in bonding the optically clear adhesive layer OCA with another part.

In some embodiments, and referring to FIG. 4A to FIG. 4C, the orthographic projection of the edge Ept of the tapered portion Pt adjacent to the polarizer PL on the plane comprising the main surface Sm of the display portion DP is between the orthographic projection of the edge Ep1 of the polarizer PL adjacent to the tapered portion Pt on the plane comprising the main surface Sm of the display portion DP and the orthographic projection of the edge Eoca connecting the first adhering surface Sa1 and the second adhering surface Sa2 on the plane comprising the main surface Sm of the display portion DP. The orthographic projection of the edge Ept of the tapered portion Pt adjacent to the polarizer PL on the plane comprising the main surface Sm of the display portion DP is spaced apart from the orthographic projection of the edge Ep1 of the polarizer PL adjacent to the tapered portion Pt on the plane comprising the main surface Sm of the display portion DP by a first spaced-apart distance d1 greater than zero, and is spaced apart from the orthographic projection of the edge Eoca connecting the first adhering surface Sa1 and the second adhering surface Sa2 on the plane comprising the main surface Sm of the display portion DP by a second spaced-apart distance d2 greater than zero. The orthographic projection of the edge Ep1 of the polarizer PL adjacent to the tapered portion Pt on the plane comprising the main surface Sm of the display portion DP and the orthographic projection of the edge Eoca connecting the first adhering surface Sa1 and the second adhering surface Sa2 on the plane comprising the main surface Sm of the display portion DP are spaced apart from each other by a sum of the first spaced-apart distance d1 and the second spaced-apart distance d2.

In addition, a position of the edge Ep1 of the polarizer PL adjacent to the tapered portion Pt may be carefully determined to prevent light leakage on the peripheral region of the display apparatus.

In some embodiments, the connecting portion CP and the display portion DP are parts of a stacked structure in the display apparatus. Referring to FIG. 4A, the display portion DP may be used as a reference for describing the structure of the stacked structure. On the first side S1 (a light emitting image display side) of the display portion DP, the stacked structure in some embodiments includes one or more of a polarizer PL on the display portion DP; an optically clear adhesive layer OCA on a side of the polarizer PL away from the display portion DP; and a cover window CF on a side of the optically clear adhesive layer OCA away from the polarizer PL. The optically clear adhesive layer OCA attaches the cover window CF to the polarizer. On a second side S2 (a back side) of the display portion DP, the stacked structure in some embodiments includes one or more of a first back film BF1 on a back surface Sb of the display portion DP on the second side S2, a support layer SL (e.g., a metal support layer) on a side of the second back film BF1 away from the display portion DP; a metal plate MP on a side of the support layer SL away from the second back film BF2; a second back film BF2 on a side of the metal plate MP away from the support layer SL; and the connecting portion CP on a side of the second back film BF2 away from the metal plate MP.

Figure 4D:
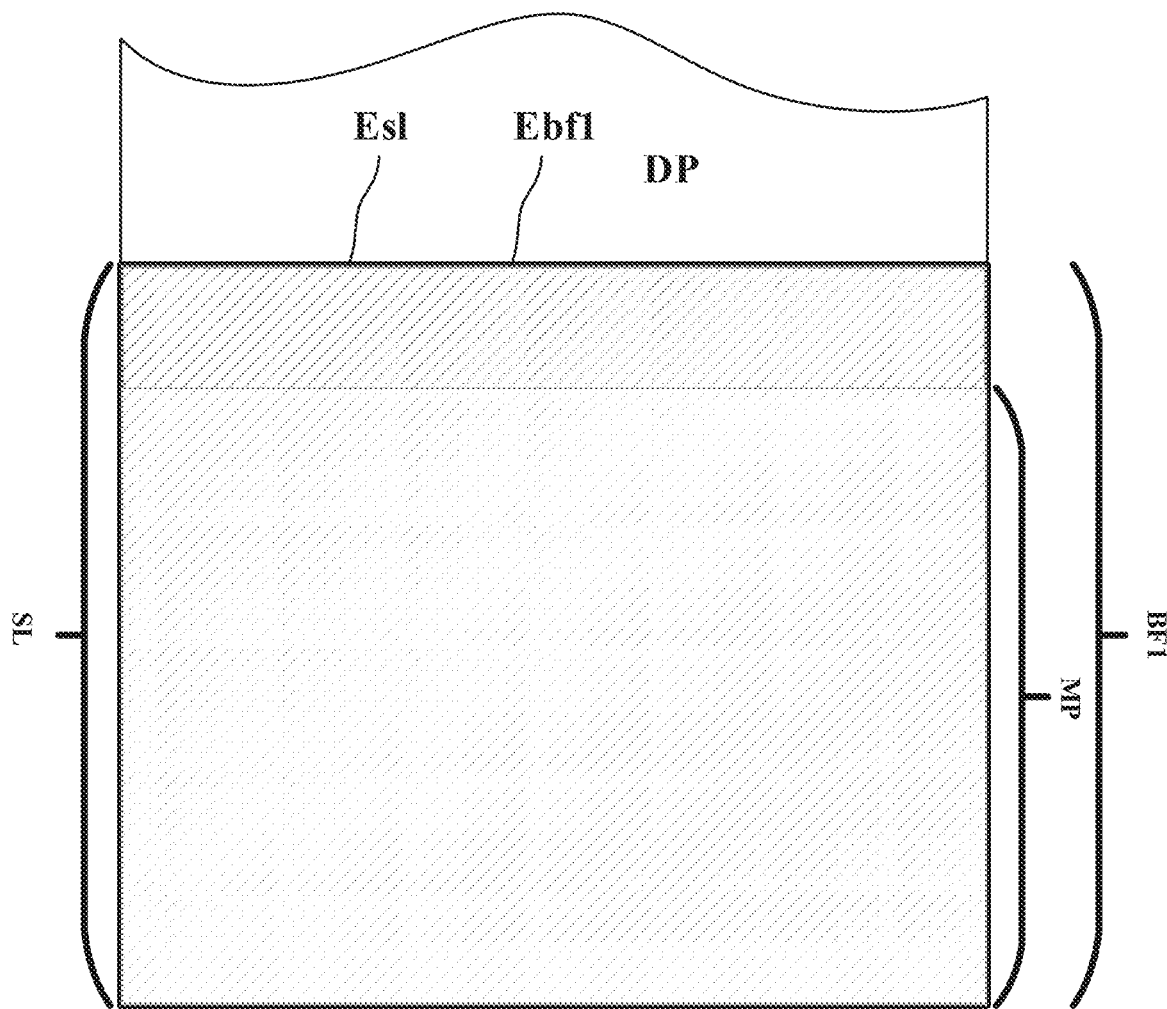
FIG. 4D is a plan view of a support layer, a first back film, and a metal plate in some embodiments according to the present disclosure.

FIG. 4D is a plan view of a support layer, a first back film, and a metal plate in some embodiments according to the present disclosure. Referring to FIG. 4A to FIG. 4D, in some embodiments, an orthographic projection of the support layer SL on the display portion DP substantially overlaps with an orthographic projection of the first back film BF1 on the display portion DP. Optionally, an orthographic projection of an edge Es1 of the support layer SL on the display portion DP substantially overlaps with an orthographic projection of an edge Ebf1 of the first back film BF1 on the display portion DP. Optionally, an orthographic projection of the first back film BF1 on the display portion DP covers an orthographic projection of the metal plate MP on the display portion DP with a margin. Optionally, an orthographic projection of the support layer SL on the display portion DP covers an orthographic projection of the metal plate MP on the display portion DP with a margin.

Figure 4E:
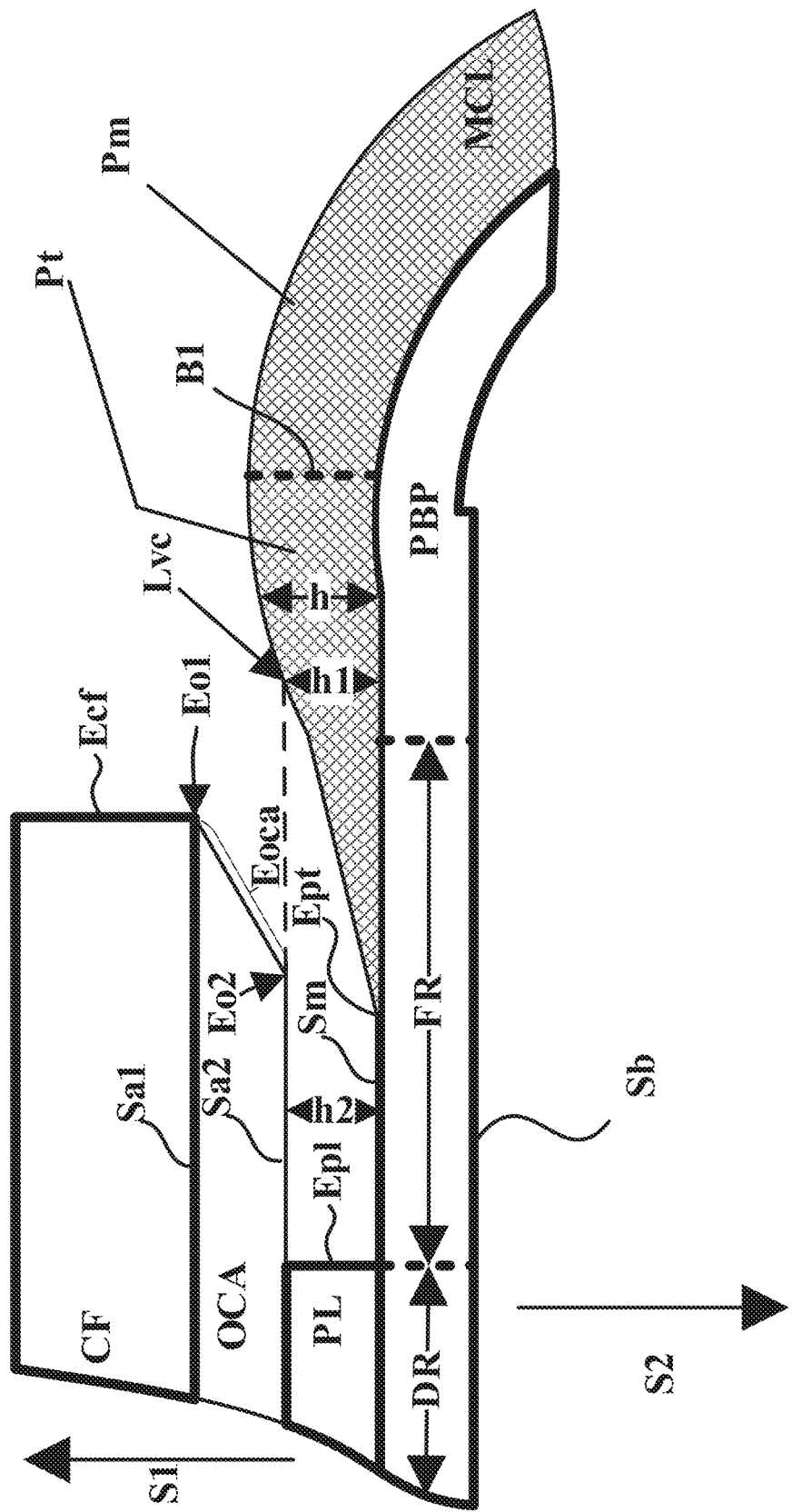
FIG. 4E is a partial view around a tapered portion of a coating layer in a display apparatus in some embodiments according to the present disclosure.

FIG. 4E is a partial view around a tapered portion of a coating layer in a display apparatus in some embodiments according to the present disclosure. Referring to FIG. 4E, in some embodiments, the edge Eoca connecting the first adhering surface Sa1 and the second adhering surface Sa2 is not a vertical edge (e.g., not an edge perpendicular to the first adhering surface Sa1 or the second adhering surface Sa2), but rather an edge having an acute slope angle with respect to the first adhering surface Sa1. Accordingly, the edge Eoca comprises a first edge Eo1 at the interface with the first adhering surface Sa1 and a second edge Eo2 at the interface with the second adhering surface Sa2. Optionally, "an orthographic projection of the edge Eoca connecting the first adhering surface Sa1 and the second adhering surface Sa2" refers to an orthographic projection of the second edge Eo2.

Figure 5:
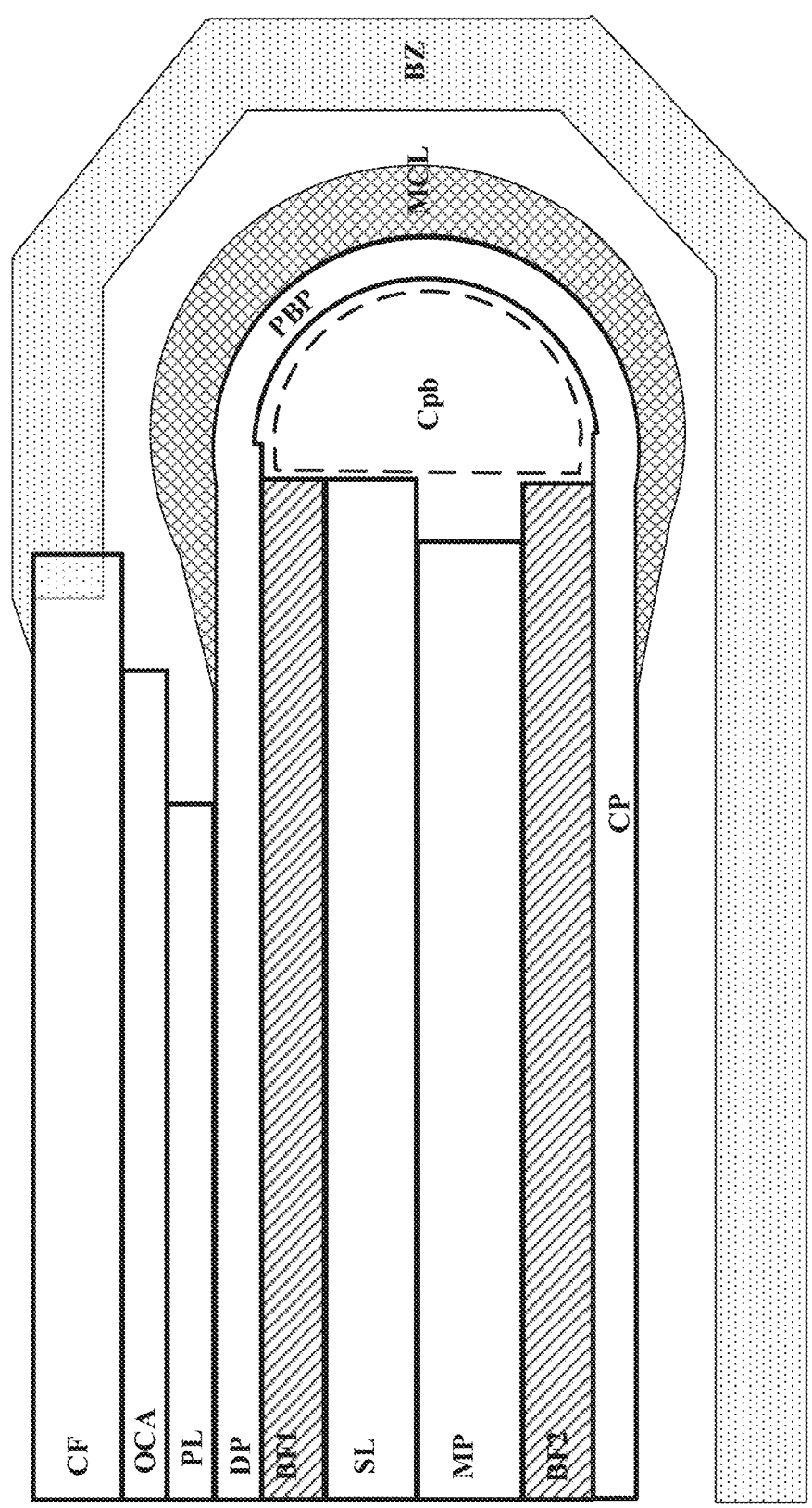
FIG. 5 is a cross-sectional view around a bending portion of a display apparatus in some embodiments according to the present disclosure.

FIG. 5 is a cross-sectional view around a bending portion of a display apparatus in some embodiments according to the present disclosure. Referring to FIG. 5, the display apparatus in some embodiments further includes a bezel BZ covering the coating layer MCL. The bezel BZ is on a side of the coating layer MCL away from the bending portion PBP. Optionally, the bezel BZ is connected to the cover window CF. Optionally, the bezel BZ is made of a relatively rigid material.

Figure 6:
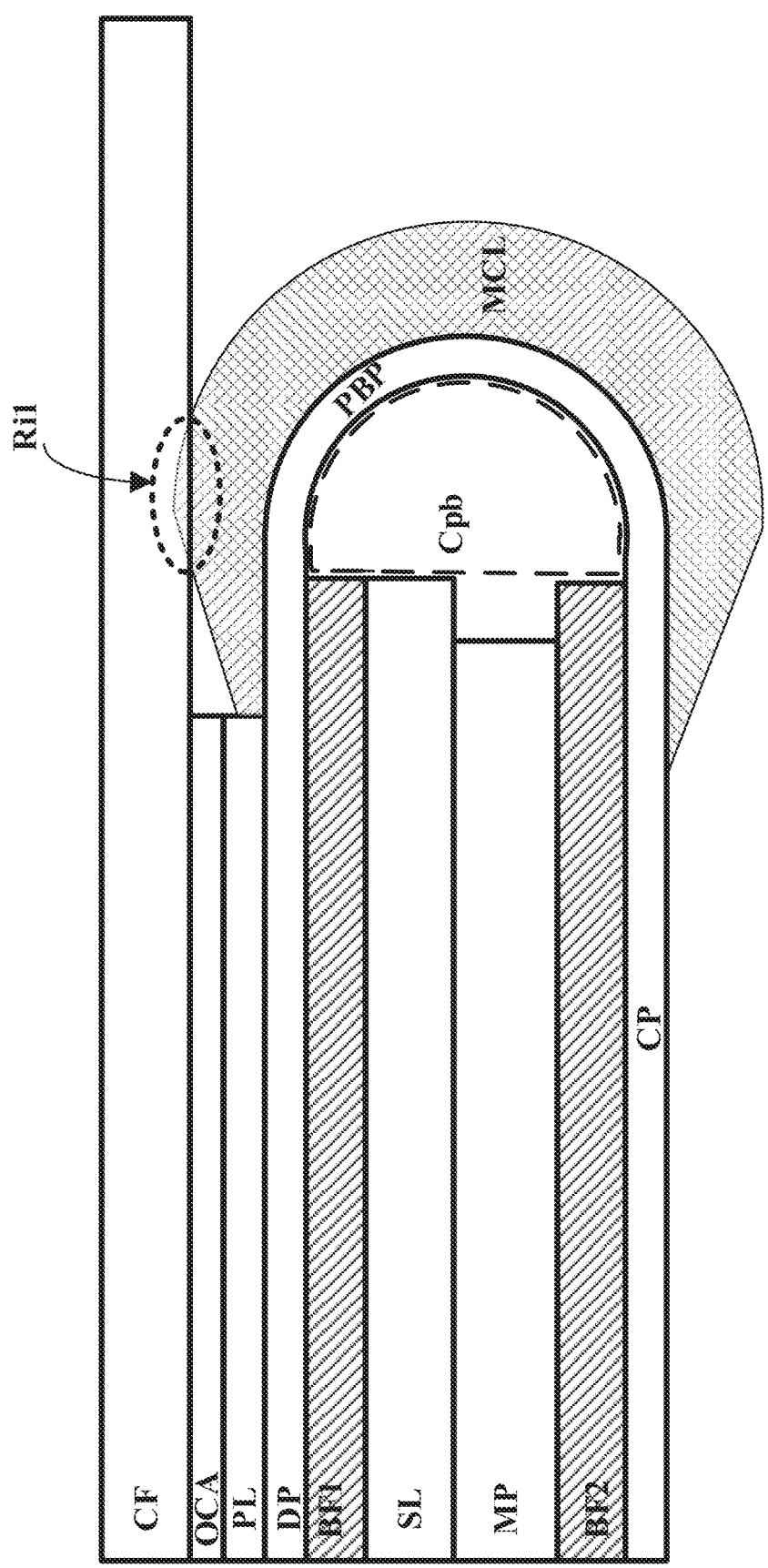
FIG. 6 is a cross-sectional view around a bending portion of a display apparatus in some embodiments according to the present disclosure.

FIG. 6 is a cross-sectional view around a bending portion of a display apparatus in some embodiments according to the present disclosure. Referring to FIG. 6, the display apparatus in some embodiments includes a display portion DP; a connecting portion CP; a bending portion PBP connecting the display portion DP and the connecting portion CP; a first back film BF1 covering a surface of the display portion DP facing the connecting portion CP; a second back film BF2 covering a surface of the connecting portion CP facing the display portion DP; a support layer SL and a metal plate MP between the first back film BF1 and the second back film BF2. The support layer SL is between the metal plate MP and the first back film BF1. The metal plate MP is between the support layer SL and the second back film BF2. As discussed above, the display apparatus in some embodiments includes a bending cavity Cpb that is surrounded by the bending portion PBP. The bending portion PBP is absent of any back film, e.g., the first back film BF1 and the second back film BF2 are absent in the region having the bending portion PBP. In one example, the cover window CF has a thickness 83±5 μm, the optically clear adhesive layer OCA has a thickness of 50±5 μm, the polarizer PL has a thickness of 55±5 μm, the coating layer MCL has a thickness of 90±30 μm. In principle, a sum of the thickness of the optically clear adhesive layer OCA and the thickness of the polarizer PL is equal to or greater than the thickness of the coating layer MCL. The inventors in the present disclosure discover that, when the thickness of the coating layer MCL reaches the maximum value (e.g., 120 μm), the thickness of the coating layer MCL becomes greater than the sum of the thickness of the optically clear adhesive layer OCA and the thickness of the polarizer PL. As shown in FIG. 6, a first interference region Ri1 is formed in which the cover window CF and the coating layer MCL interfere with each other, resulting either a bulge in the cover window CF or an excessive force on the bending portion PBP.

Accordingly, the inventors of the present disclosure have developed an intricate structure to eliminate the interference in the present display apparatus as exemplified in FIG. 4A to FIG. 4C by defining critical parameters including at least one of the first shortest distance Ds1, the second shortest distance Ds2, the third shortest distance Ds3, or the fourth shortest distance Ds4. In the present display apparatus, not only the interference between the cover window CF and the coating layer MCL can be eliminated, but also other defects such as cover window depression, bending portion cracking, and light leakage, can be effectively prevented or entirely eliminated.

Figure 7:
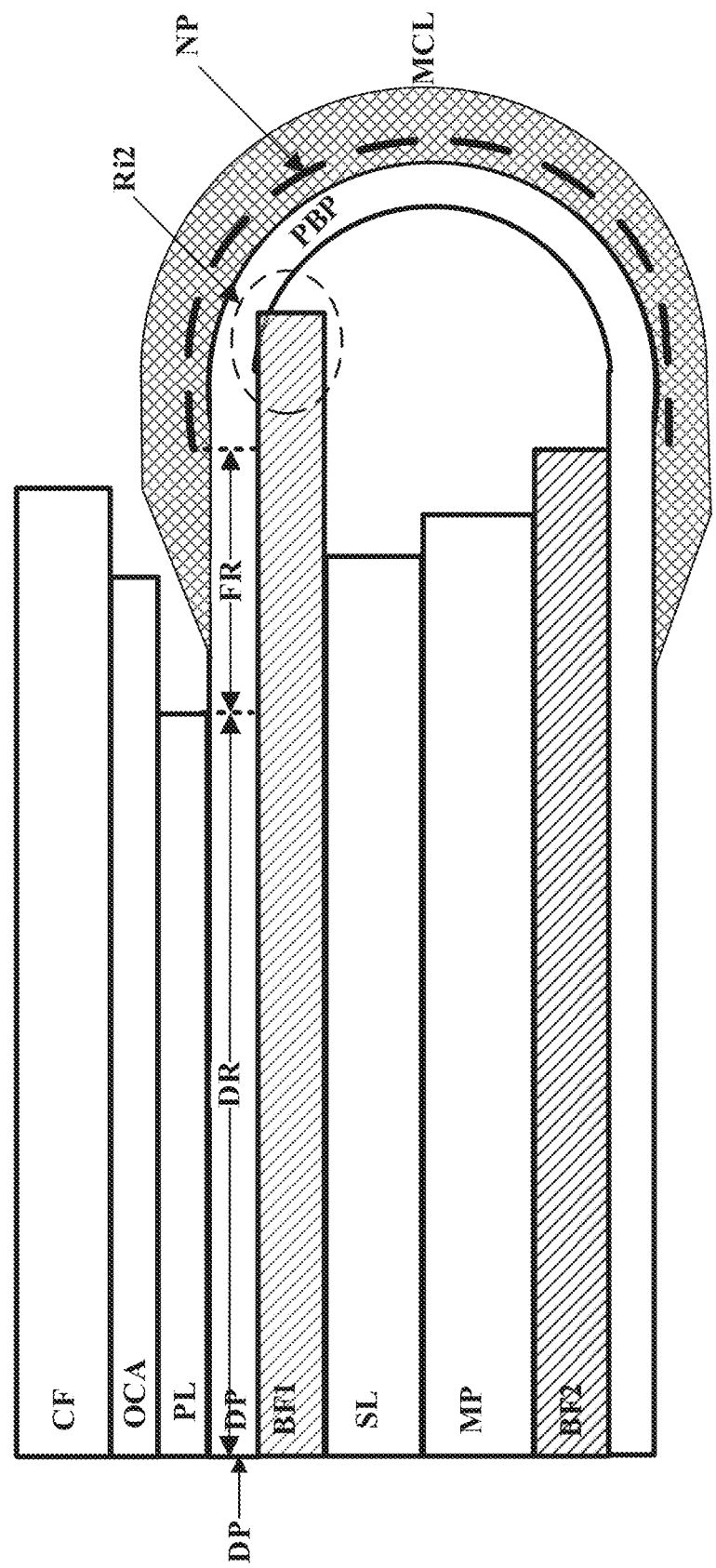
FIG. 7 is a cross-sectional view around a bending portion of a display apparatus in some embodiments according to the present disclosure.

FIG. 7 is a cross-sectional view around a bending portion of a display apparatus in some embodiments according to the present disclosure. Referring to FIG. 7, to ensure that signal lines in the bending portion PBP is not subject to stress or a reduced stress, a coating layer MCL is formed on the outer surface of the bending portion PBP to change the position of a neutral plane NP in the bending region. On the other hand, to enhance the flexibility of the bending portion PBP, back film is removed from the bending portion. For example, the bending portion PBP is absent of any back film, e.g., the first back film BF1 and the second back film BF2 are absent in the region having the bending portion PBP. In the fanout region FR, however, the first back film BF1 is maintained to protect the signal lines therein. The inventors of the present disclosure discover that, due to various engineering tolerances (e.g., a material tolerance of the first back film BF1, a bonding tolerance of the first back film BF1, a bending tolerance of the bending portion PBP, a flow tolerance of the coating layer MCL, and an overlength of the neutral plane NP), the back film (such as the first back film BF1) and the bending portion PBP could interfere with each other. As shown in FIG. 7, a second interference region Ri2 is formed in which the first back film BF1 and the bending portion PBP interfere with each other, resulting an excessive force on the bending portion PBP. As used herein, the term "material tolerance" refers to a tolerance for an error or a range of error introduced by a material forming a part of the display apparatus, e.g., a material forming the first back film BF1. As used herein, the term "bonding tolerance" refers to a tolerance for an error or a range of error in bonding two parts of the display apparatus, for example, in bonding the first back film BF1, e.g., to the display portion DP. The error may be due to an alignment error in bonding the first back film BF1 with another part. As used herein, the term "bending tolerance" refers to a tolerance for an error or a range of error in bending a part or parts of the display apparatus, for example, in bending the bending portion PBP. As used herein, the term "flow tolerance" refers to a tolerance for an error or a range of error in forming a part of the display apparatus due to the fact that a material forming the part is not completely solid and is prone to flow. As used herein, the term "overlength of the neutral plane" denotes a change (e.g., a difference, or an increase) in a length of a neutral plane as a result of the change of the position of a neutral plane NP in the bending region upon forming the coating layer MCL on the outer surface of the pad pending portion PBP.

Figure 8A:
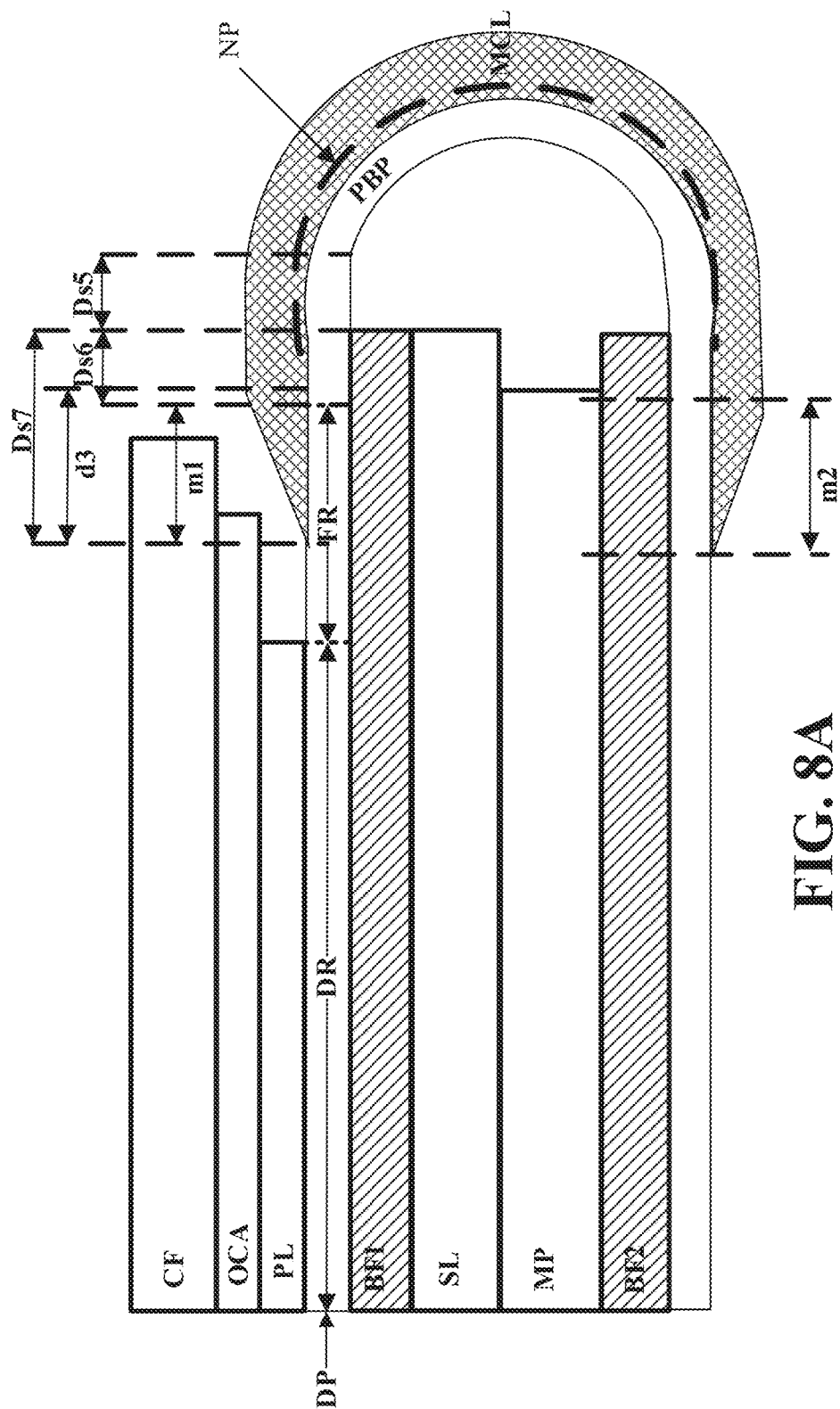
FIG. 8A is a cross-sectional view around a bending portion of a display apparatus in some embodiments according to the present disclosure.
Figure 8B:
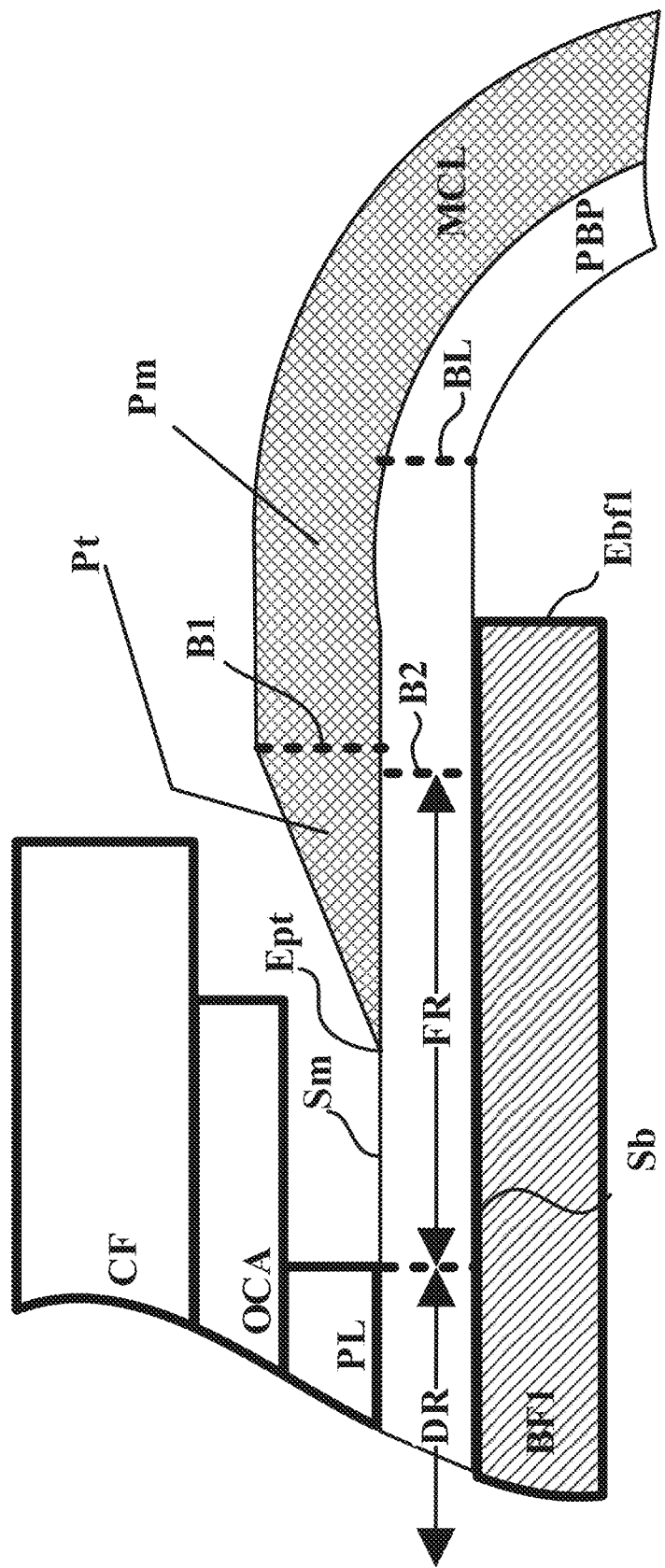
FIG. 8B is a partial view around a tapered portion of a coating layer in a display apparatus in some embodiments according to the present disclosure.
Figure 8C:
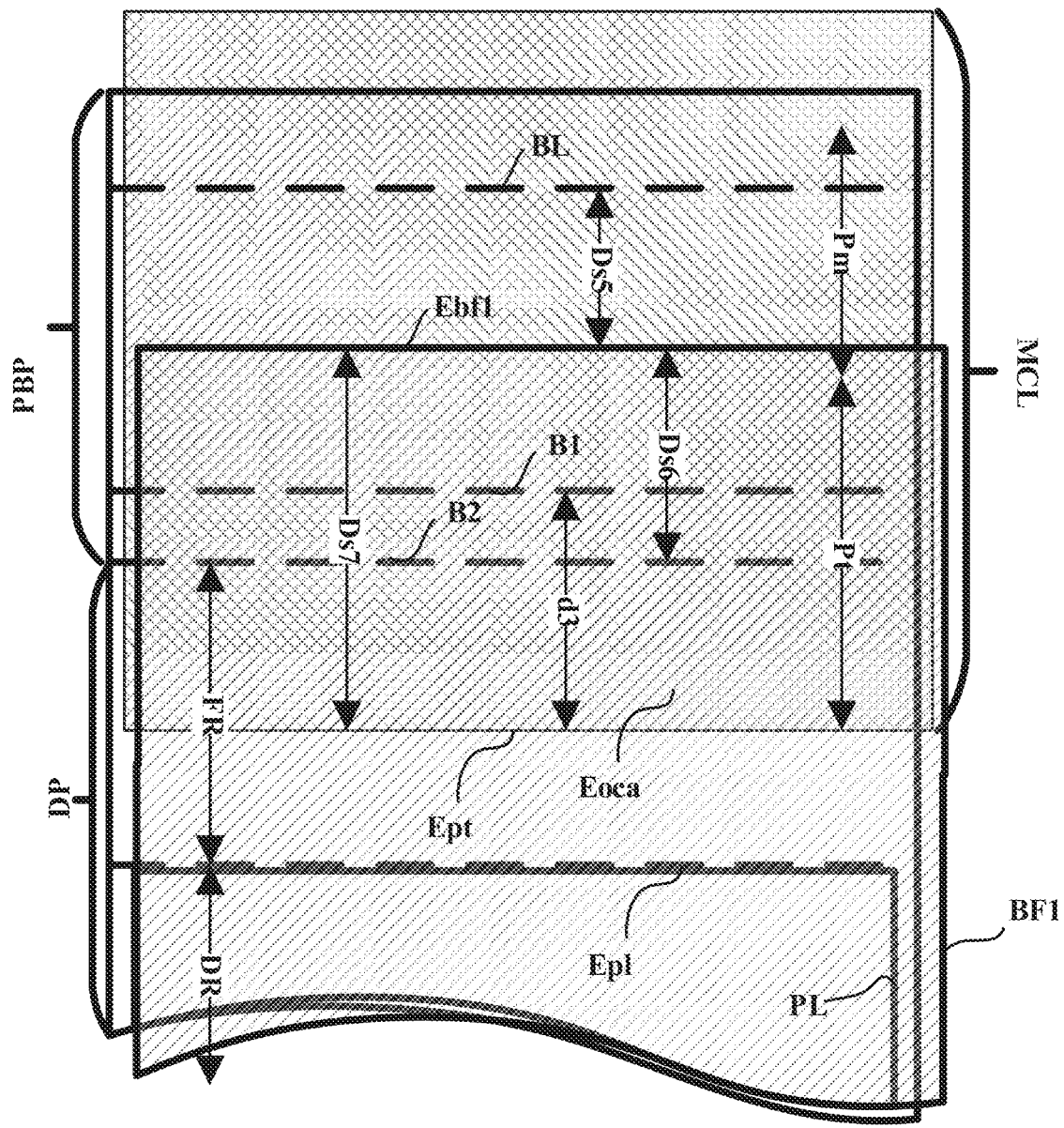
FIG. 8C is a partial plan view around a tapered portion of a coating layer in a display apparatus in some embodiments according to the present disclosure.

To prevent this issue, the inventors of the present disclosure have further improved the structure of the display apparatus. FIG. 8A is a cross-sectional view around a bending portion of a display apparatus in some embodiments according to the present disclosure. FIG. 8B is a partial view around a tapered portion of a coating layer in a display apparatus in some embodiments according to the present disclosure. FIG. 8C is a partial plan view around a tapered portion of a coating layer in a display apparatus in some embodiments according to the present disclosure. Referring to FIG. 8A to FIG. 8C, in some embodiments, an orthographic projection of an edge Ebf1 of the first back film BF1 adjacent to the bending portion PBP on the plane comprising the main surface Sm of the display portion DP is between an orthographic projection of a boundary B2 between the fanout region FR and the bending portion PBP on the plane comprising the main surface Sm of the display portion DP and an orthographic projection of a bending line BL, along which the bending portion PBP is bent, on the plane comprising the main surface Sm of the display portion DP. Moreover, the orthographic projection of the edge Ebf1 of the first back film BF1 adjacent to the bending portion PBP on the plane comprising the main surface Sm of the display portion DP is also between the orthographic projection of the boundary B1 between the tapered portion PT and the main portion Pm on the plane comprising the main surface Sm of the display portion DP and an orthographic projection of a bending line BL, along which the bending portion PBP is bent, on the plane comprising the main surface Sm of the display portion DP.

In some embodiments, referring to FIG. 8A to FIG. 8C, a fifth shortest distance Ds5 between the orthographic projection of the edge Ebf1 of the first back film BF1 adjacent to the bending portion PBP on the plane comprising the main surface Sm of the display portion DP and the orthographic projection of the bending line BL on the plane comprising the main surface Sm of the display portion DP is equal to or greater than a third value.

In some embodiments, the third value can be expressed as $\sqrt{a^2+b^2}$; wherein a is a bonding tolerance of the first back film BF1; and b is a bending tolerance of the bending portion PBP. Optionally, the bonding tolerance of the first back film BF1 is in a range of 50 μm to 150 μm, e.g., 50 μm to 75 μm, 75 μm to 100 μm, 100 μm to 125 μm, or 125 μm to 150 μm. Optionally, the bonding tolerance of the first back film BF1 is 100 μm. Optionally, the bending tolerance of the bending portion PBP is in a range of 50 μm to 150 μm, e.g., 50 μm to 75 μm, 75 μm to 100 μm, 100 μm to 125 μm, or 125 μm to 150 μm. Optionally, the bending tolerance of the bending portion PBP is 100 μm. Optionally, the third value is in a range of 100 μm to 200 μm, e.g., 100 μm to 125 μm, 125 μm to 150 μm, 150 μm to 175 μm, or 175 μm to 200 μm. Optionally, the third value is 150 μm. Optionally, the fifth shortest distance Ds5 is equal to or greater than 150 μm.

In some embodiments, referring to FIG. 8A to FIG. 8C, a sixth shortest distance Ds6 between the orthographic projection of the edge Ebf1 of the first back film BF1 adjacent to the bending portion PBP on the plane comprising the main surface Sm of the display portion DP and the orthographic projection of the boundary B2 between the fanout region FR and the bending portion PBP on the plane comprising the main surface Sm of the display portion DP is equal to or greater than a fourth value which is a composite tolerance calculated based on a bonding tolerance of the first back film BF1 and a material tolerance of the first back film BF1. Optionally, the fourth value is in a range of 100 μm to 200 μm, e.g., 100 μm to 125 μm, 125 μm to 150 μm, 150 μm to 175 μm, or 175 μm to 200 μm. Optionally, the fourth value is 150 μm. Optionally, the sixth shortest distance Ds6 is equal to or greater than 150 μm.

In some embodiments, referring to FIG. 8A to FIG. 8C, a seventh shortest distance Ds7 between the orthographic projection of the edge Ebf1 of the first back film BF1 adjacent to the bending portion PBP on the plane comprising the main surface Sm of the display portion DP and the orthographic projection of the edge Ept of the tapered portion adjacent to the polarizer PL on the plane comprising the main surface Sm of the display portion DP is equal to or greater than a fifth value which is a sum of a flow tolerance of the coating layer MCL, the bonding tolerance of the first back film BF1, and an overlength of a neutral plane NP of a structure comprising the bending portion PBP and the coating layer MCL. Optionally, the flow tolerance of the coating layer MCL is in a range of 150 μm to 250 μm, e.g., 150 μm to 175 μm, 175 μm to 200 μm, 200 μm to 225 μm, or 225 μm to 250 μm. Optionally, the flow tolerance of the coating layer MCL is 200 μm. Optionally, the bonding tolerance of the first back film BF1 is in a range of 50 μm to 150 μm, e.g., 50 μm to 75 μm, 75 μm to 100 μm, 100 μm to 125 µm or 125 µm to 150 µm. Optionally, the bonding tolerance of the first back film BF1 is 100 µm. Optionally, the overlength of the neutral plane NP is in a range of 50 µm to 150 µm, e.g., 50 µm to 75 µm, 75 µm to 100 µm, 100 µm to 125 µm, or 125 µm to 150 µm. Optionally, the overlength of the neutral plane NP is 100 µm. Optionally, the fifth value is in a range of 300 µm to 500 µm, e.g., 300 µm to 350 µm, 350 µm to 400 µm, 400 µm to 450 µm, or 450 µm to 500 µm. Optionally, the fifth value is 400 µm. Optionally, the seventh shortest distance Ds7 is equal to or greater than 400 µm.

In some embodiments, referring to FIG. 8A to FIG. 8C, a distance d3 between the orthographic projection of the edge Ept of the tapered portion Pt adjacent to the polarizer PL on the plane comprising the main surface Sm of the display portion DP and the orthographic projection of the boundary B1 between the tapered portion Pt and the main portion on the plane comprising the main surface Sm of the display portion DP is less than 400 µm, e.g., less than 390 µm, less than 380 µm, less than 370 µm, less than 360 µm, or less than 350 µm.

Figure 9A:
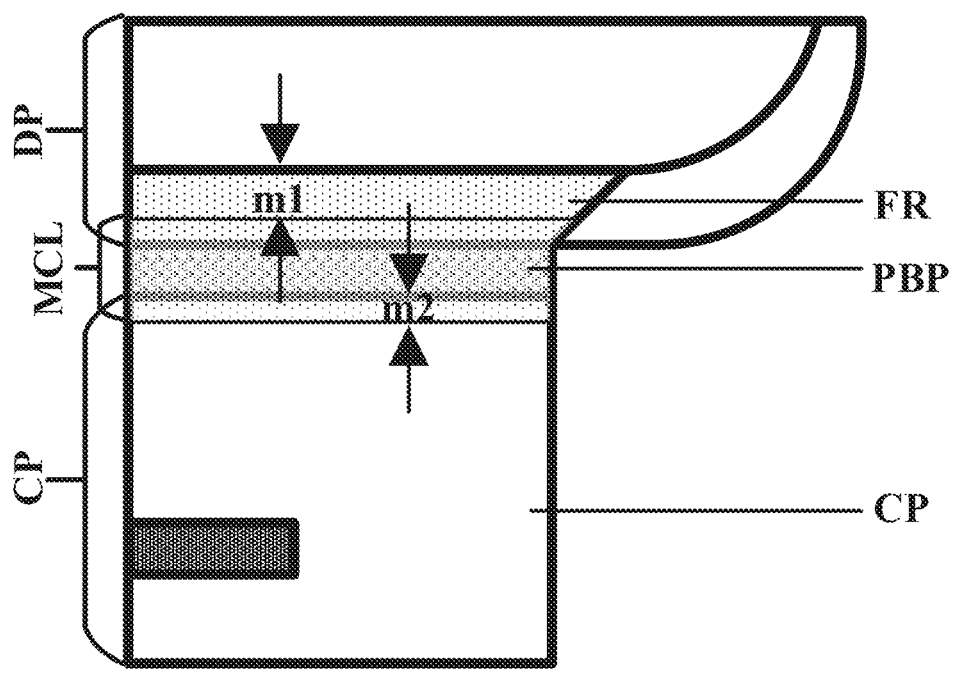
FIG. 9A is a zoom-in view of a region circled by dotted line in FIG. 3 in some embodiments according to the present disclosure.

FIG. 9A is a zoom-in view of a region circled by dotted line in FIG. 3 in some embodiments according to the present disclosure. Referring to FIG. 8A and FIG. 9A, in some embodiments, the coating layer MCL covering the back side of the bending portion PBP extends onto the first side S1 of the display portion DP by a first margin m1, and extends onto a side of the connecting portion CP opposite to the display portion DP by a second margin m2. Optionally, the first margin m1 and the second margin m2 are respectively in a range of 150 µm to 250 µm, e.g., 150 µm to 175 µm, 175 µm to 200 µm, 200 µm to 225 µm, or 225 µm to 250 µm. Optionally, the first margin m1 is 200 µm, and the second margin m2 is 200 µm (see, also, FIG. 4A).

Figure 9B:
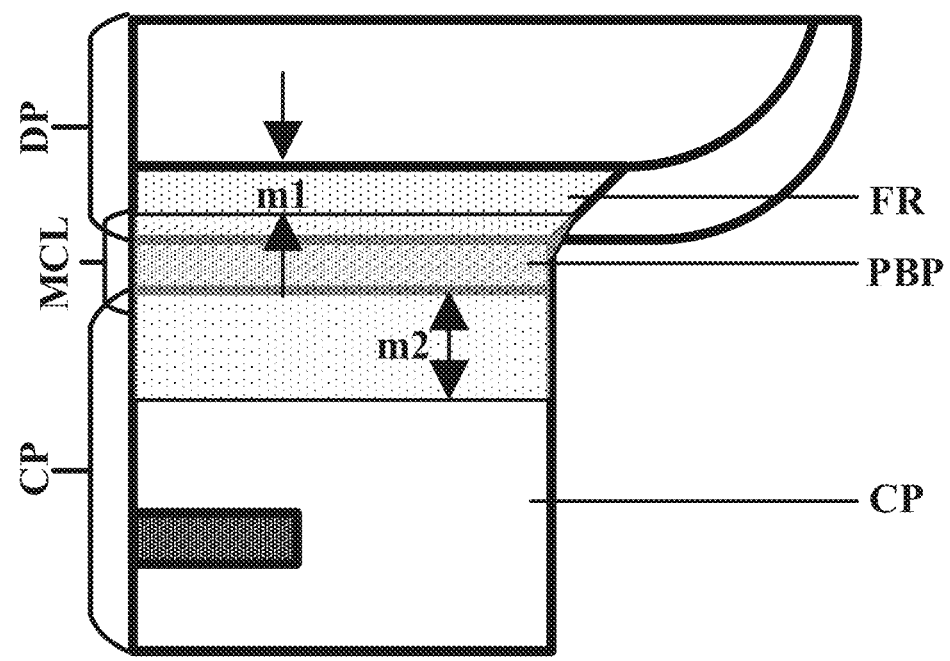
FIG. 9B is a zoom-in view of a region circled by dotted line in FIG. 3 in some embodiments according to the present disclosure.

FIG. 9B is a zoom-in view of a region circled by dotted line in FIG. 3 in some embodiments according to the present disclosure. Referring to FIG. 8A and FIG. 9B, in some embodiments, the coating layer MCL covering the back side of the bending portion PBP extends onto the first side S1 of the display portion DP by a first margin m1, and extends onto a side of the connecting portion CP opposite to the display portion DP by a second margin m2. Optionally, the second margin m2 is greater than the first margin m1 (see, also, FIG. 11).

Figure 10:
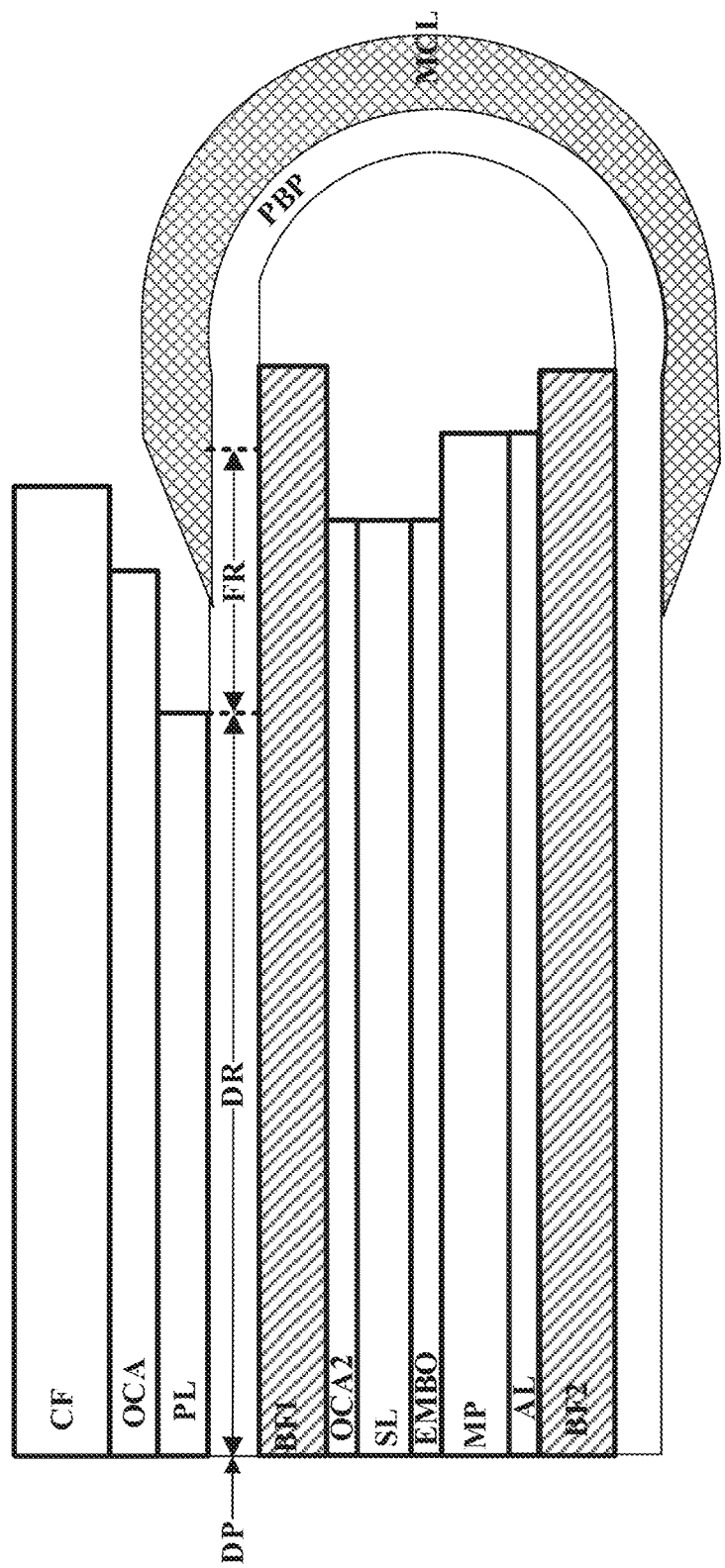
FIG. 10 is a cross-sectional view around a bending portion of a display apparatus in some embodiments according to the present disclosure.

FIG. 10 is a cross-sectional view around a bending portion of a display apparatus in some embodiments according to the present disclosure. Referring to FIG. 10, the display apparatus in some embodiments further includes a second optically clear adhesive layer OCA2 between the first back film BF1 and the support layer SL (e.g., a metal support layer), the second optically clear adhesive layer OCA2 adhering the first back film BF1 and the support layer SL together. Optionally, the display apparatus further includes an adhesive layer AL between the metal plate MP and the second back film BF2, the adhesive layer AL adhering the metal plate MP and the second back film BF2 together. Optionally, the support layer SL has a thickness in a range of 30 µm to 50 µm, e.g., 30 µm to 35 µm, 35 µm to 40 µm, 40 µm to 45 µm, or 45 µm to 50 µm. Optionally, the metal plate MP has a thickness in a range of 0.5 mm to 5 mm, e.g., 0.5 mm to 1.0 mm, 1.0 mm to 1.5 mm, 1.5 mm to 2.0 mm, 2.0 mm to 2.5 mm, 2.5 mm to 3.0 mm, 3.0 mm to 3.5 mm, 3.5 mm to 4.0 mm, 4.0 mm to 4.5 mm, or 4.5 mm to 5.0 mm. Optionally, the display apparatus further includes an Embo-type adhesive layer EMBO between the support layer SL and the metal plate MP. The Embo-type adhesive layer EMBO attaches the support layer SL and the metal plate MP together. The Embo-type adhesive layer EMBO has a mesh pattern structure that facilitates releasing air between the support layer SL and the metal plate MP when they are attached together. Optionally, the Embo-type adhesive layer EMBO has a thickness that is 1.5 times to 2.5 times of a thickness of the support layer SL.

Figure 11:
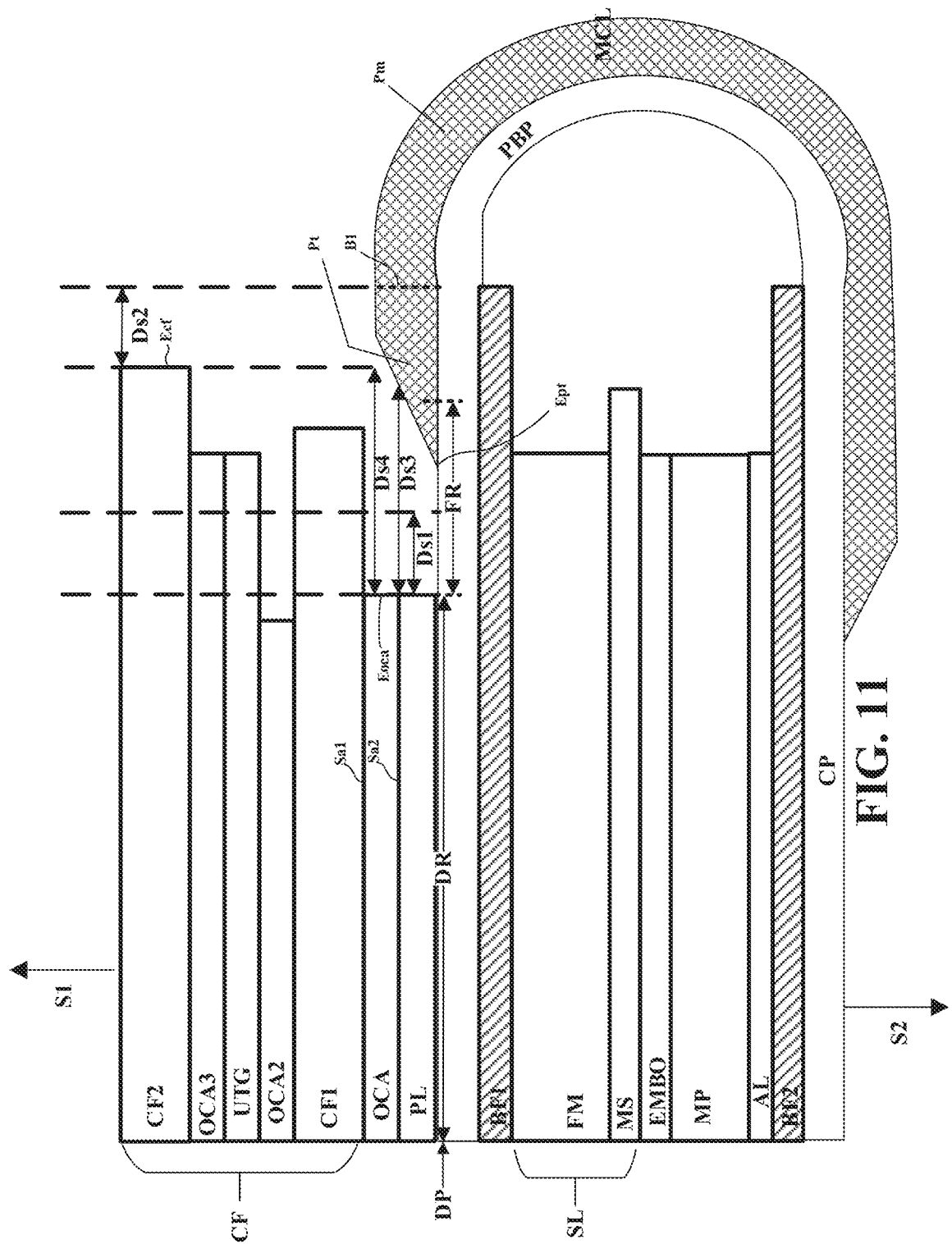
FIG. 11 is a cross-sectional view around a bending portion of a display apparatus in some embodiments according to the present disclosure.

FIG. 11 is a cross-sectional view around a bending portion of a display apparatus in some embodiments according to the present disclosure. Referring to FIG. 11, the display apparatus in some embodiments further includes an adhesive layer AL between the metal plate MP and the second back film BF2, the adhesive layer AL adhering the metal plate MP and the second back film BF2 together. Optionally, the display apparatus further includes a support layer SL between the metal plate MP and the first back film BF1. Optionally, the support layer SL includes a double-layer structure. Optionally, the support layer SL includes a metal support layer MS and a foam layer FM. Optionally, the display apparatus further includes an Embo-type adhesive layer EMBO between the metal support layer MS and the metal plate MP.

In some embodiments, the cover window CF of the display apparatus has a multi-layer structure. Optionally, the multi-layer structure includes a first cover sublayer CF1 on a side of the optically clear adhesive layer OCA away from the polarizer PL, an ultra thin glass UTG on a side of the first cover sublayer CF1 away from the optically clear adhesive layer OCA, and a second optically clear adhesive layer OCA2 between the ultra thin glass UTG and the first cover sublayer CF1, the second optically clear adhesive layer OCA2 adhering the ultra thin glass UTG and the first cover sublayer CF1 together. Optionally, the multi-layer structure further includes a second cover sublayer CF2 on a side of the ultra thin glass UTG away from the first cover sublayer CF1, and a third optically clear adhesive layer OCA3 between the ultra thin glass UTG and the second cover sublayer CF2, the third optically clear adhesive layer OCA3 adhering the ultra thin glass UTG and the second cover sublayer CF2 together. Optionally, the first cover sublayer CF1 and the second cover sublayer CF2 are made of an organic polymer such as polyamine or polyethylene terephthalate. Optionally, the second cover sublayer CF2 further includes a hard coating layer thereon. Optionally, the second cover sublayer CF2 further includes a protective film.

As shown in FIG. 11, an orthographic projection of the second cover sublayer CF2 on the display portion DP covers an orthographic projection of the ultra thin glass UTG on the display portion DP with a margin. An orthographic projection of the third optically clear adhesive layer OCA3 on the display portion DP and the orthographic projection of the ultra thin glass UTG on the display portion DP are substantially overlapping with each other, e.g., edges of the third optically clear adhesive layer OCA3 and the ultra thin glass UTG proximal to the coating layer MCL are flush with each other. The orthographic projection of the ultra thin glass UTG on the display portion DP covers an orthographic projection of the second optically clear adhesive layer OCA2 on the display portion DP with a margin. An orthographic projection of the optically clear adhesive layer OCA on the display portion DP and an orthographic projection of the polarizer PL on the display portion DP are substantially overlapping with each other, e.g., edges of the optically clear adhesive layer OCA and the polarizer PL proximal to the coating layer MCL are flush with each other.

Optionally, the orthographic projection of the first cover sublayer CF1 on the display portion DP and the orthographic projection of the second cover sublayer CF2 on the display portion DP are substantially overlapping with each other, and they cover the orthographic projection of the ultra thin glass UTG on the display portion DP with a margin.

Optionally, the optically clear adhesive layer OCA has a thickness in a range of 10 μm to 50 μm, e.g., 10 μm to 20 μm, 20 μm to 30 μm, 30 μm to 40 μm, or 40 μm to 50 μm. Optionally, the second optically clear adhesive layer OCA2 has a thickness in a range of 10 μm to 50 μm, e.g., 10 μm to 20 μm, 20 μm to 30 μm, 30 μm to 40 μm, or 40 μm to 50 μm. Optionally, the third optically clear adhesive layer OCA3 has a thickness in a range of 10 μm to 50 μm, e.g., 10 μm to 20 μm, 20 μm to 30 μm, 30 μm to 40 μm, or 40 μm to 50 μm. Optionally, the optically clear adhesive layer OCA has a thickness of 25 μm. Optionally, the second optically clear adhesive layer OCA2 has a thickness of 25 μm. Optionally, the third optically clear adhesive layer OCA3 has a thickness of 25 μm.

Optionally, the ultra thin glass UTG has a thickness in a range of 20 μm to 40 μm, e.g., 20 μm to 25 μm, 25 μm to 30 μm, 30 μm to 35 μm, or 35 μm to 40 μm. Optionally, the ultra thin glass UTG has a thickness of 30 μm.

Optionally, the first cover sublayer CF1 has a thickness in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the first cover sublayer CF1 has a thickness of 50 μm. Optionally, the first cover sublayer CF1 has a thickness of 55 μm. Optionally, the second cover sublayer CF2 has a thickness in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the second cover sublayer CF2 has a thickness of 50 μm. Optionally, the second cover sublayer CF2 has a thickness of 55 μm.

Optionally, the polarizer Pt, has a thickness in a range of 20 μm to 40 μm, e.g., 20 μm to 25 μm, 25 μm to 30 μm, 30 μm to 35 μm, or 35 μm to 40 μm. Optionally, the polarizer PL has a thickness of 31 μm.

Optionally, the metal support layer MS has a thickness in a range of 20 μm to 250 μm, e.g., 20 μm to 35 μm, 35 μm to 50 μm, 50 μm to 100 μm, 100 μm to 150 μm, 150 μm to 200 μm, or 200 μm to 250 μm. Optionally, the metal support layer MS has a thickness of 150 μm. Optionally, the metal support layer MS has a thickness of 40 μm.

Optionally, the foam layer FM has a thickness in a range of 50 μm to 210 μm, e.g., 50 μm to 70 μm, 70 μm to 90 μm, 90 μm to 110 μm, 110 μm to 130 μm, 130 μm to 150 μm, 150 μm to 170 μm, 170 μm to 190 μm, or 190 μm to 210 μm. Optionally, the foam layer FM has a thickness of 150 μm. Optionally, the foam layer FM has a thickness of 120 μm.

Optionally, the first back film BF1 has a thickness in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the first back film BF1 has a thickness of 50 μm. Optionally, the second back film BF2 has a thickness in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the second back film BF2 has a thickness of 50 μm.

Optionally, the display apparatus further include an ink layer between the first cover sublayer CF1 and the second optically clear adhesive layer OCA2. Optionally, the display apparatus further include a second ink layer between the second cover sublayer CF2 and the third optically clear adhesive layer OCA3. Optionally, the display apparatus further include a third ink layer between the ultra thin glass UTG and the second optically clear adhesive layer OCA3.

Figure 12:
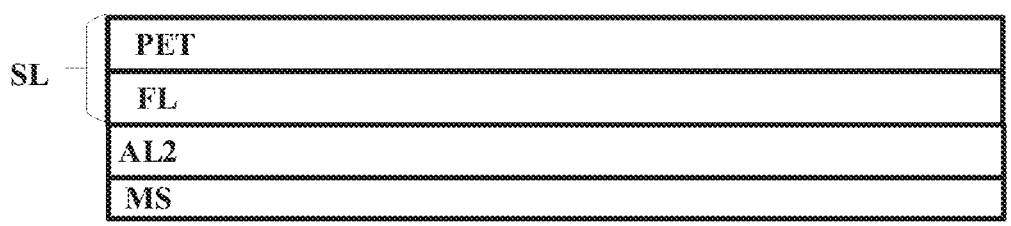
FIG. 12 illustrates a partial stacked structure including a support layer in some embodiments according to the present disclosure.

Optionally, the support layer SL includes a buffering material having buffeting function, for example, an organic material such as a foam (e.g., the foam layer FM in FIG. 11). Optionally, the support layer SL includes a silicone. Optionally, the support layer SL includes a double-sided adhesive layer. Optionally, the support layer SL includes a metallic material such as stainless steel. Optionally, the support layer SL includes a foam layer and a polyethylene terephthalate layer. FIG. 12 illustrates a partial stacked structure including a support layer in some embodiments according to the present disclosure. Referring to FIG. 12, the support layer SL includes a foam layer FL and a polyethylene terephthalate layer PET. The display apparatus further include a second adhesive layer AL2 between the support layer SL and the metal support layer MS, the second adhesive layer SL2 including a pressure sensitive adhesive material.

In some embodiments, the display apparatus further includes a camera hole. Optionally, the first cover sublayer CF1 (and optionally the second cover sublayer CF2) covers the camera hole. The camera hole is underneath the first cover sublayer CF1 (and optionally the second cover sublayer CF2). The camera hole does not extend into the first cover sublayer CF1 (and optionally the second cover sublayer CF2).

In some embodiments, the coating layer MCL covers a first portion of the first back film BF1 by a first margin, and covers a second portion of the second portion of the second back film BF2 by a second margin. Optionally, the first margin and the second margin are different from each other. Optionally, the first margin is greater than the second margin. Optionally, the second margin is greater than the first margin.

Referring to FIG. 4A, FIG. 4B, and FIG. 11, in some embodiments, an orthographic projection of an edge Ecf of the cover window CF on a plane comprising the main surface Sm of the display portion DP is between an orthographic projection of the edge Ept of the tapered portion Pt adjacent to the polarizer PL on the plane comprising the main surface Sm of the display portion DP and an orthographic projection of the boundary B1 between the tapered portion Pt and the main portion Pm on the plane comprising the main surface Sm of the display portion DP. Optionally, the orthographic projection of the edge Ept of the tapered portion Pt adjacent to the polarizer PL on the plane comprising the main surface Sm of the display portion DP is between the orthographic projection of the edge Ecf of the cover window CF on the plane comprising the main surface Sm of the display portion DP and an orthographic projection of an edge of the polarizer PL on the plane comprising the main surface Sm of the display portion DR Optionally, an orthographic projection of the edge Eoca connecting the first adhering surface Sa1 and the second adhering surface Sa2 on the plane comprising the main surface Sm of the display portion DP is aligned with the orthographic projection of the edge of the polarizer PL adjacent to the tapered portion Pt on the plane comprising the main surface Sm of the display portion DP, or is between the orthographic projection of the edge of the polarizer PL adjacent to the tapered portion Pt on the plane comprising the main surface Sm of the display portion DP and the orthographic projection of the edge Ecf of the cover window Cf adjacent to the tapered portion Pt on the plane comprising the main surface Sm of the display portion DP.

Figure 13A:
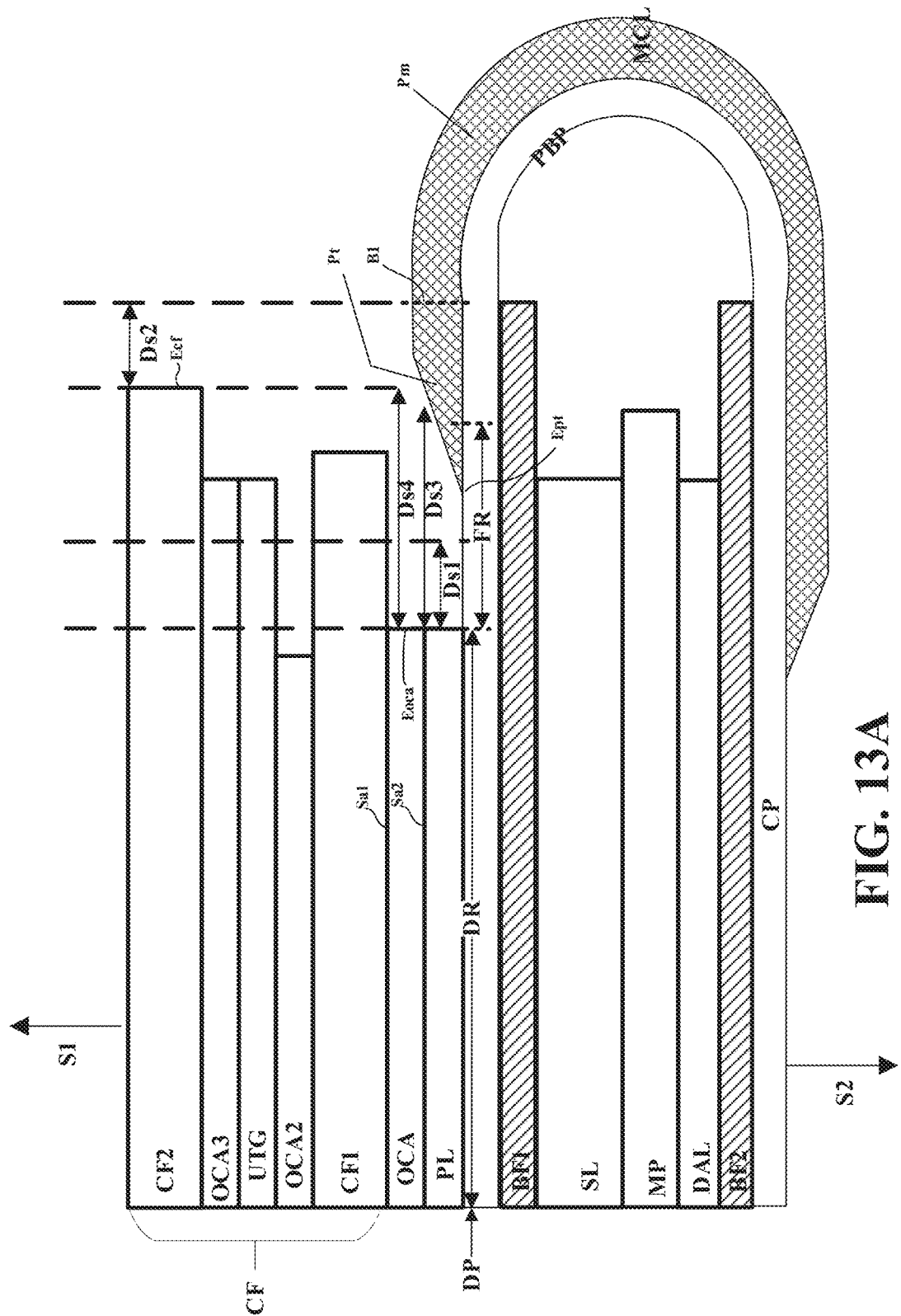
FIG. 13A is a cross-sectional view around a bending portion of a display apparatus in some embodiments according to the present disclosure.

FIG. 13A is a cross-sectional view around a bending portion of a display apparatus in some embodiments according to the present disclosure. The structure of the display apparatus in FIG. 13A is similar to the structure of the display apparatus in FIG. 11, except for the layers between the first back film BF1 and the second back film BF2. Referring to FIG. 13, the display apparatus in some embodiments includes a support layer SL on a side of the first back film BF1 away from the display portion DP; a metal plate MP on a side of the support layer SL away from the first back film BF1; and a double-sided adhesive layer DAL between the metal plate MP and the second back film BF2. The double-sided adhesive layer DAL adheres the metal plate MP and the second back film BF2 together. Optionally, the support layer SL includes a buffering material having buffering function, for example, an organic material such as a foam (e.g., a foam layer).

Figure 13B:
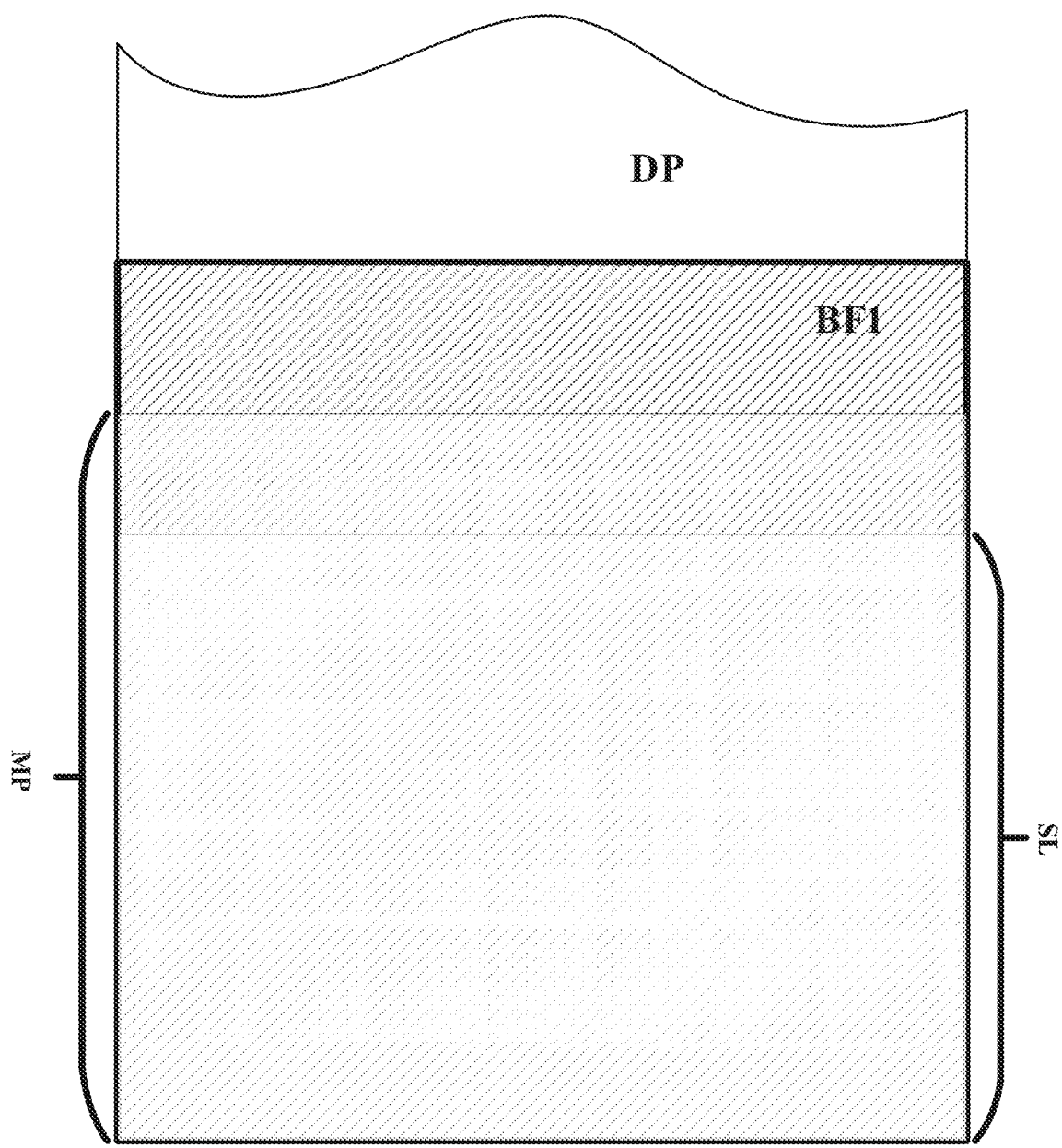
FIG. 13B is a plan view of a support layer, a first back film, and a metal plate in some embodiments according to the present disclosure.

FIG. 13B is a plan view of a support layer, a first back film, and a metal plate in some embodiments according to the present disclosure. Referring to FIG. 13A and FIG. 13B, in some embodiments, an orthographic projection of the metal plate MP on the display portion DP covers an orthographic projection of the support layer SL on the display portion DP with a margin. Optionally, an orthographic projection of the first back film BF1 on the display portion DP covers an orthographic projection of the metal plate MP on the display portion DP with a margin.

In another aspect, the present disclosure provides a method of fabricating a display apparatus. In some embodiments, the method includes forming a structure comprising a display panel having a display portion in a display region, a connecting portion, and a bending portion connecting the display portion and the connecting portion, wherein a flexible base substrate extends throughout the display portion, the bending portion and the connecting portion as a unitary structure that is substantially flat; forming a polarizer on a first side of the display portion; forming a cover window on the first side of the display portion, and on a side of the polarizer away from the display portion; forming a back film covering a surface of the flexible base substrate; removing a portion of the back film in a region having the bending portion, thereby forming a first back film covering a surface of the display portion and a second back film covering a surface of the connecting portion; bending the bending portion so that the first back film is facing the second back film, thereby forming a bending cavity that is surrounded by the bending portion; providing a metal plate between the display portion and the connecting portion; providing a support layer (e.g., a metal support layer) between the display portion and the connecting portion; forming a coating layer covering a back side of the bending portion opposite to a side directly surrounding the bending cavity. Optionally, the coating layer is formed to have a main portion, and a tapered portion extending from the main portion toward the polarizer. Optionally, a height of the tapered portion, relative to a main surface of the display portion on the first side, gradually increases from an edge of the tapered portion adjacent to the polarizer to a boundary between the tapered portion and the main portion. Optionally, the boundary is one at which the tapered portion has a maximum height relative to the main surface of the display portion on the first side. Optionally, the boundary is a boundary that is co-planar with an edge of the first back film proximal to the bending cavity. Optionally, an orthographic projection of the cover window on a plane comprising the main surface of the display portion is between an orthographic projection of the edge of the tapered portion adjacent to the polarizer on the plane comprising the main surface of the display portion and an orthographic projection of the boundary between the tapered portion and the main portion on the plane comprising the main surface of the display portion. Optionally, a first shortest distance between an orthographic projection of an edge of the polarizer adjacent to the tapered portion on the plane comprising the main surface of the display portion and the orthographic projection of the edge of the tapered portion adjacent to the polarizer on the plane comprising the main surface of the display portion is equal to or greater than a first value. Optionally, a second shortest distance between an orthographic projection of an edge of the cover window adjacent to the tapered portion on the plane comprising the main surface of the display portion and the orthographic projection of the boundary between the tapered portion and the main portion on the plane comprising the main surface of the display portion is also equal to or greater than the first value. As used herein, the term "substantially flat" may include small deviations from flat surface geometries, for example, deviations due to manufacturing processes.

Figure 14A:
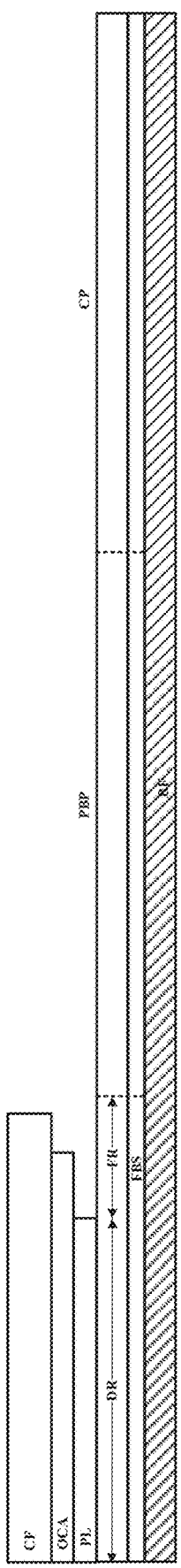
FIG. 14A to FIG. 14E illustrate a method of fabricating a display apparatus in some embodiments.

FIG. 14A to FIG. 14D illustrate a method of fabricating a display apparatus in some embodiments. Referring to FIG. 14A, a structure having a display portion DP in a display region DR, a connecting portion CP, and a bending portion PBP connecting the display portion DP and the connecting portion CP is formed. A flexible base substrate FBS in the structure extends throughout the display portion DP, the bending portion PBP, and the connecting portion CP as a unitary structure that is substantially flat. A back film BF is formed to cover a surface of the flexible base substrate FBS, e.g., a surface of the flexible base substrate FBS on a side away from the cover window CF. On the first side S1 of the display portion DP, a polarizer PL is formed. An optically clear adhesive layer OCA is formed on the first side S1 of the display portion DP, and on a side of the polarizer PL away from the display portion DP. A cover window CF on the first side S1 of the display portion DP, and on a side of the optically clear adhesive layer OCA away from the polarizer PL. The optically clear adhesive layer OCA is formed between the polarizer PL and the cover window CF, the optically clear adhesive layer attaching the cover window CF to the polarizer PL.

Figure 14B:
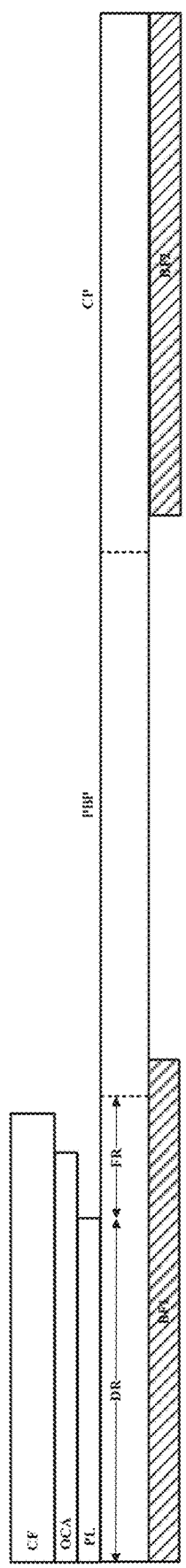

Referring to FIG. 14B, a portion of the back film in a region having the bending portion PBP is then removed, thereby forming a first back film BF1 covering a surface of the display portion DP and a second back film BF2 covering a surface of the connecting portion CP.

Figure 14C:
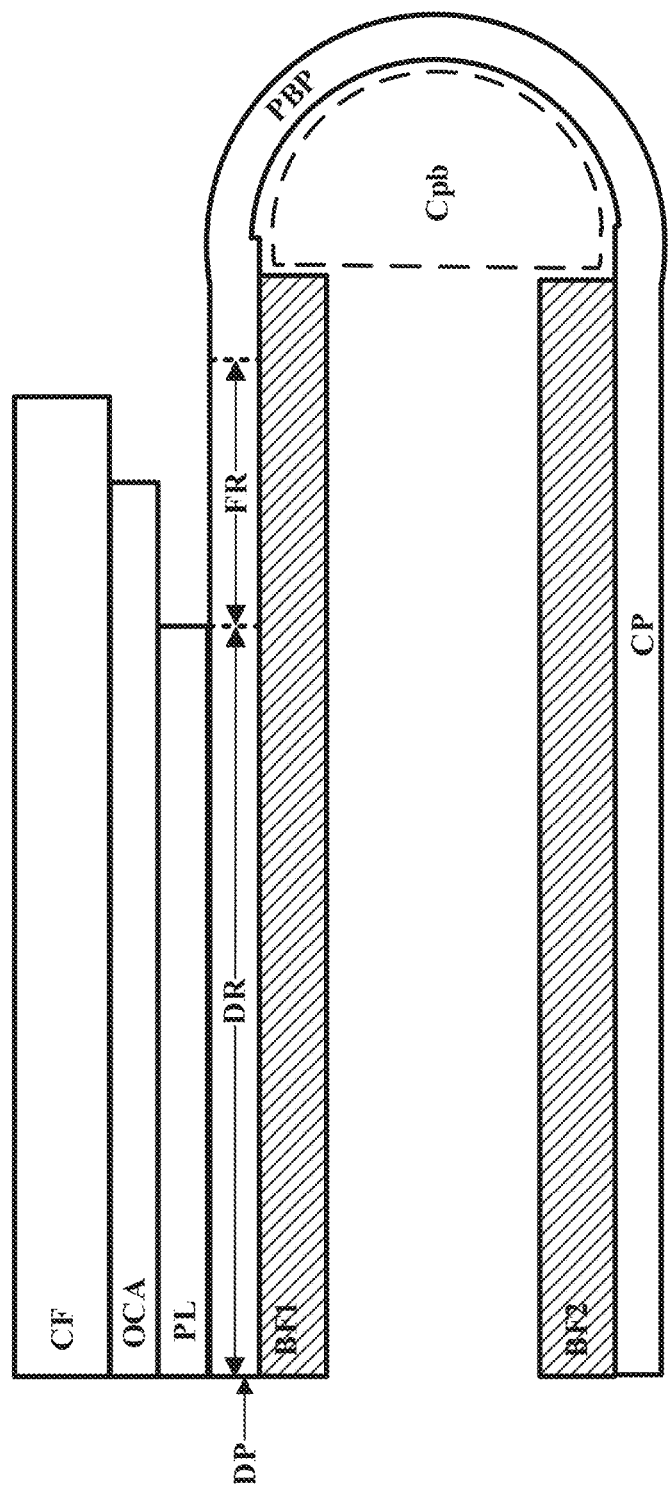

Referring to FIG. 14C, the bending portion PBP is then bent so that the first back film BF1 is facing the second back film BF2, thereby forming a bending cavity Cpb that is surrounded by the bending portion PBP.

Figure 14D:
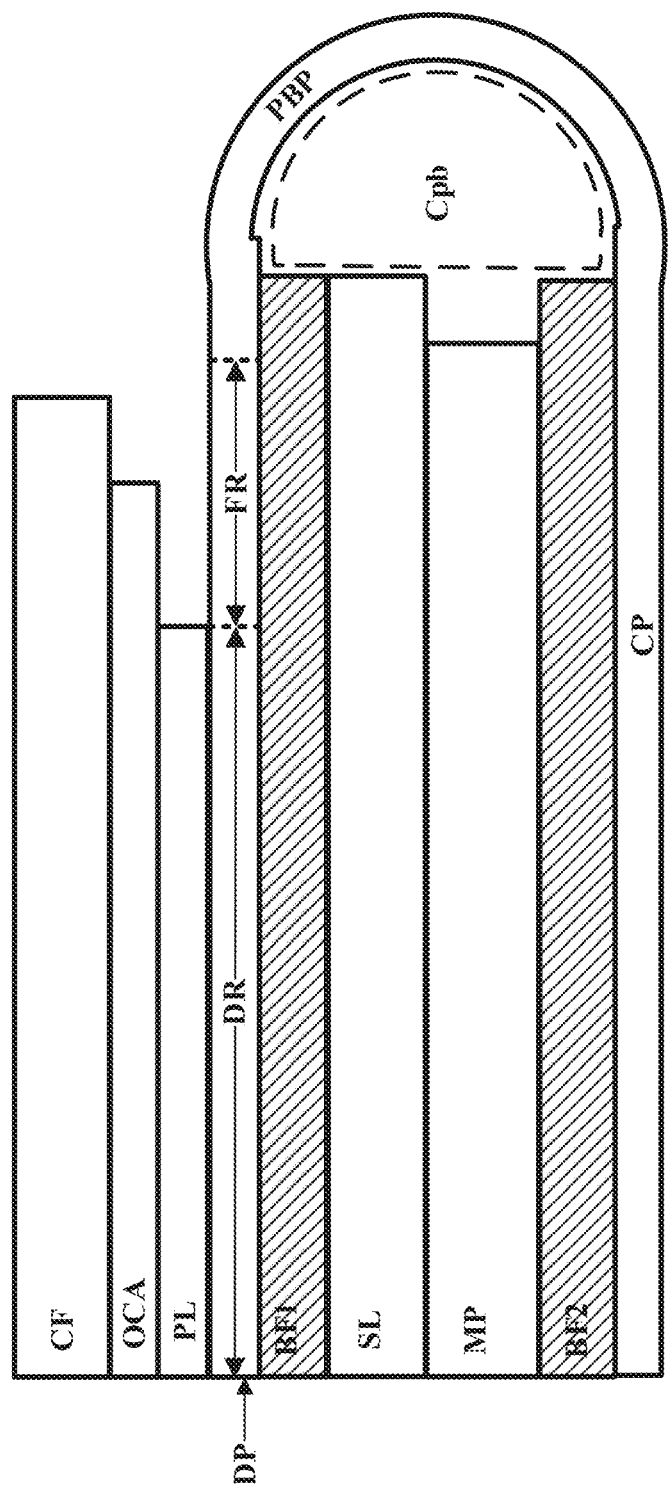

Referring to FIG. 14D, a metal plate MP between the display portion DP and the connecting portion CP; and a support layer SL (e.g., a metal support layer) between the display portion DP and the connecting portion CP.

Figure 14E:
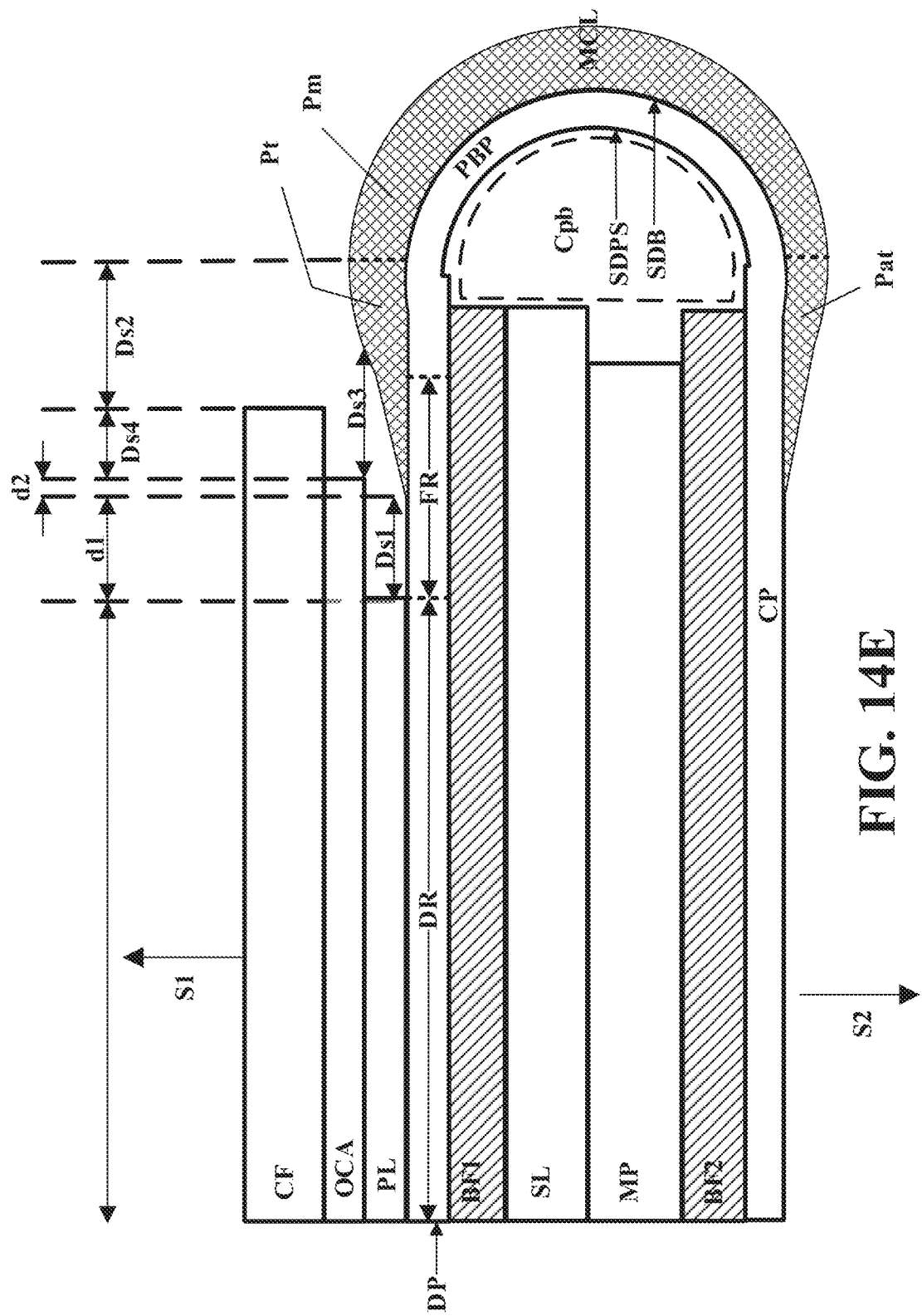

Referring to FIG. 14E, a coating layer MCL is formed covering a back side SDB of the bending portion PBP opposite to a side SDPS directly surrounding the bending cavity Cpb. As shown in FIG. 14E, the coating layer MCL is formed to have a main portion Pm, and a tapered portion Pt extending from the main portion Pm toward the polarizer PL. Referring to FIG. 14E, FIG. 4A, FIG. 4B, and FIG. 4C, a height of the tapered portion Pt, relative to a main surface Sm of the display portion DP on the first side S1, gradually increases from an edge Ept of the tapered portion Pt adjacent to the polarizer PL to a boundary B1 between the tapered portion Pt and the main portion Pm. Optionally, the boundary B1 is a boundary at which the tapered portion Pt has a maximum height relative to the main surface Sm of the display portion DP on the first side S1. Optionally, the boundary B1 is a boundary that is co-planar with an edge of the first back film BF1 proximal to the bending cavity Cpb. An orthographic projection of the cover window CF on a plane comprising the main surface Sm of the display portion DP is between an orthographic projection of the edge Ept of the tapered portion Pt adjacent to the polarizer PL on the plane comprising the main surface Sm of the display portion SP and an orthographic projection of the boundary B1 between the tapered portion Pt and the main portion Pm on the plane comprising the main surface Sm of the display portion DP.

Optionally, a first shortest distance Ds1 between an orthographic projection of an edge Ep1 of the polarizer PL adjacent to the tapered portion Pt on the plane comprising the main surface Sm of the display portion DP and the orthographic projection of the edge Ept of the tapered portion Pt adjacent to the polarizer PL on the plane comprising the main surface Sm of the display portion DP is equal to or greater than a first value. Optionally, a second shortest distance Ds2 between an orthographic projection of an edge Ecf of the cover window adjacent to the tapered portion Pt on the plane comprising the main surface Sm of the display portion DP and the orthographic projection of the boundary B1 between the tapered portion Pt and the main portion Pm on the plane comprising the main surface Sm of the display portion DP is also equal to or greater than the first value.

In some embodiments, the method further includes forming a stacked structure, in which the connecting portion CP and the display portion DP are parts of the stacked structure in the display apparatus. Referring to FIG. 14E, the display portion DP may be used as a reference for describing the structure of the stacked structure. On the first side S1 (a light emitting image display side) of the display portion DP, forming the stacked structure in some embodiments includes one or more steps of: forming a polarizer PL on the display portion DP; forming an optically clear adhesive layer OCA on a side of the polarizer PL away from the display portion DP; and forming a cover window CF on a side of the optically clear adhesive layer OCA away from the polarizer PL. The optically clear adhesive layer OCA is formed to attach the cover window CF to the polarizer. On a second side S2 (a back side) of the display portion DP, forming the stacked structure in some embodiments includes one or more steps of: forming a first back film BF1 on a back surface Sb of the display portion DP on the second side S2; providing a support layer SL on a side of the first back film BF1 away from the display portion DP; providing a metal plate MP on a side of the support layer SL away from the first back film BF1; forming a second back film BF2 on a side of the metal plate MP away from the support, layer SL; and forming the connecting portion CP on a side of the second back film BF2 away from the metal plate MP.

Various appropriate materials and various appropriate fabricating methods may be used to make the first back film and the second back film. For example, a flexible organic polymer material may be used to form the first back film and the second back film. Examples of appropriate flexible organic polymer materials include, but are not limited to, polyimide, polycarbonate, polyethersulfone, polyethylene terephthalate, polyethylene naphthalate, polyarylate, and fiber-reinforced plastic.

Various appropriate materials and various appropriate fabricating methods may be used to make the flexible base substrate. For example, a flexible organic polymer material may be used to form the flexible base substrate. Examples of appropriate flexible organic polymer materials include, but are not limited to, polyimide, polycarbonate, polyethersulfone, polyethylene terephthalate, polyethylene naphthalate, polyarylate, and fiber-reinforced plastic.

Various appropriate materials and various appropriate fabricating methods may be used to make the coating layer. For example, a UV curable adhesive material may be used to form the coating layer. Examples of UV curable adhesives include UV curable adhesive materials that contain a free radical generating photoinitiator and a compound having multiple unsaturated groups (e.g., acrylate, methacrylate or vinyl groups), such as an oligomer having multiple unsaturated groups and, optionally, a monomer having multiple unsaturated groups. Specific examples of free radical generating photoinitiators include, for example, type I or type II photoinitiators, such as benzoin ether, 1-hydroxy-cyclohexylphenyl-ketone or benzophenone, among others. Specific examples of oligomers having multiple unsaturated groups include acrylate oligomers such as epoxy acrylates (e.g., bisphenol-A-epoxy acrylate), aliphatic urethane acrylates (e.g., IPDI-based aliphatic urethane acrylates), aromatic urethane acrylates, polyether acrylates, polyester acrylates, aminated acrylates, and acrylic acrylates. Specific examples of monomers include mono- di- and tri-functional monomers such as trimethylolpropane triacrylate, propoxylated trimethylolpropane triacrylate, ethoxylated trimethylolpropane triacrylate, tripropylene glycol diacrylate, hexanediol diacrylate, isobornyl acrylate, isodecyl acrylate, ethoxylated phenyl acrylate, and 2-phenoxyethyl acrylate, among others. Further examples of UV curable adhesives include UV curable adhesive materials that comprise a cationic photoinitiator and an epoxide compound. Particular examples of cationic photoinitiators include onium salts such as aryl sulfonium and aryl iodonium salts. Specific examples of epoxide compounds include cycloaliphatic epoxide compounds and aromatic epoxide compounds such as 3,4-epoxy-cyclohexylmethyl-3,4-epoxy-cyclohexane-carboxylate and Bisphenol A diglycidyl ether, and polysiloxanes having epoxy groups, among others.

Various appropriate materials and various appropriate fabricating methods may be used to make the optically clear adhesive layer OCA. Examples of appropriate optically clear adhesive materials include, but are not limited to, polyacrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the Embo-type adhesive layer EMBO. Examples of appropriate Embo-type adhesive materials include, but are not limited to, polyacrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the cover window CF and the second cover window CF2. Examples of appropriate materials for making the cover window CF and the second cover window CF2 include, but are not limited to, polyamine such as colorless polyamine, thin glass, ultrathin glass, polyethylene terephthalate, polyacrylate, polymethylmethacrylate, polycarbonate, polyethylene naphthalate, polyvinylidene chloride, polyvinylidene difluoride, polystyrene, an ethylene vinyl alcohol copolymer, and/or a combination thereof. Optionally, the cover window CF or the second cover window CF2 has a double-layer structure including a first sub-layer, a second sub-layer, and an adhesive sub-layer adhering the first sub-layer and the second sub-layer together. Optionally, the first sub-layer and the second sub-layer are made of a colorless polyamine, and the adhesive sub-layer is an optically clear adhesive sub-layer. Optionally, the cover window CF or the second cover window CF2 further includes a hard coating sub-layer. Optionally, the cover window CF or the second cover window CF2 further includes a protective film. Optionally, the first sub-layer has a thickness in a range of 60 μm to 120 μm, e.g. 60 μm to 70 μm, 70 μm to 80 μm, 80 μm to 90 μm, 90 μm to 100 μm, 100 μm to 110 μm, or 110 μm to 120 μm. Optionally, the second sub-layer has a thickness in a range of 60 μm to 120 μm, e.g. 60 μm to 70 μm, 70 μm to 80 μm, 80 μm to 90 μm, 90 μm to 100 μm, 100 μm to 110 μm, or 110 μm to 120 μm. Optionally, the adhesive sub-layer has a thickness in a range of 30 μm to 70 μm, e.g. 30 μm to 40 μm, 40 μm to 50 μm, 50 μm to 60 μm, or 60 μm to 70 μm. Optionally, the hard coating sub-layer has a thickness in a range of 5 μm to 15 μm, e.g., 5 μm to 10 μm, or 10 μm to 15 μm.

Various appropriate materials and various appropriate fabricating methods may be used to make the adhesive layer AL and the second adhesive layer AL2. For example, a pressure sensitive adhesive material may be used to form the adhesive layer AL and the second adhesive layer AL2. Examples of appropriate pressure sensitive adhesive materials include, but are not limited to, an acrylate-based adhesive material, such as homopolymers and copolymers of acrylic acid, methacrylic acid, isooctyl acrylate, acrylamide, methacrylamide, acrylonitrile, methacrylonitrile, methyl isoamyl acrylate, 2-ethyl hexylacrylate, and butyl acrylate.

Various appropriate materials and various appropriate fabricating methods may be used to make the support layer. Optionally, the support layer includes an organic material layer (e.g., a foam layer FM in FIG. 11). For example, an organic polymer material may be used to form the organic material layer (e.g., the foam layer FM). Examples of appropriate organic polymer materials include, but are not limited to, polyethylene terephthalate. Optionally, the support layer includes metal support layer. Various appropriate materials and various appropriate fabricating methods may be used to make the metal support layer. For example, a metallic material may be used to form the metal support layer. Examples of appropriate metallic materials include, but are not limited to, aluminum and copper, and various appropriate alloys or laminates.

Various appropriate materials and various appropriate fabricating methods may be used to make the metal plate. For example, a metallic material may be used to form the metal plate. Examples of appropriate metallic materials include, but are not limited to, aluminum and copper, and various appropriate alloys or laminates.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
a display panel comprising a display portion, a connecting portion, and a bending portion;
a polarizer on a first side of the display portion;
a cover window on the first side of the display portion, and on a side of the polarizer away from the display portion;
a coating layer comprising a main portion, and a tapered portion extending from the main portion toward the polarizer, wherein the bending portion connects the display portion and the connecting portion, the bending portion is bent so that the connecting portion is facing a second side of the display portion, forming a bending cavity that is surrounded by the bending portion, the second side being opposite to the first side, the coating layer covers a back side of the bending portion opposite to a side directly surrounding the bending cavity;
an optically clear adhesive layer on the first side of the display portion, and between the polarizer and the cover window, the optically clear adhesive layer attaching the cover window to the polarizer, wherein the optically clear adhesive layer has a first adhering surface at least partially attaching to the cover window, a second adhering surface at least partially attaching to the polarizer, and an edge connecting the first adhering surface and the second adhering surface and adjacent to the tapered portion; and
a first back film covering a back surface of the display portion on the second side;
wherein an orthographic projection of an edge of the tapered portion adjacent to the polarizer on a plane comprising a main surface of the display portion is between an orthographic projection of an edge of the cover window on the plane comprising the main surface of the display portion and an orthographic projection of an edge of the polarizer on the plane comprising the main surface of the display portion; and
an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion, or is between the orthographic projection of the edge of the polarizer adjacent to the tapered portion on the plane comprising the main surface of the display portion and the orthographic projection of the edge of the cover window adjacent to the tapered portion on the plane comprising the main surface of the display portion;

wherein the display portion has a display region in which an image is displayed and a fanout region between the display region and the bending portion, the display portion comprising a plurality of signal lines extending through the fanout region; and an orthographic projection of an edge of the first back film adjacent to the bending portion on the plane comprising the main surface of the display portion is between an orthographic projection of a boundary between the fanout region and the bending portion on the plane comprising the main surface of the display portion and an orthographic projection of a bending line, along which the bending portion is bent, on the plane comprising the main surface of the display portion.

2. The display apparatus of claim 1, wherein a height of the tapered portion, relative to the main surface of the display portion on the first side, gradually increases from an edge of the tapered portion adjacent to the polarizer to a boundary between the tapered portion and the main portion;
   a first shortest distance between an orthographic projection of an edge of the polarizer adjacent to the tapered portion on the plane comprising the main surface of the display portion and the orthographic projection of the edge of the tapered portion adjacent to the polarizer on the plane comprising the main surface of the display portion is equal to or greater than a first value.

3. The display apparatus of claim 1, wherein a fourth shortest distance between the orthographic projection of the edge connecting the first adhering surface and the second adhering surface on the plane comprising the main surface of the display portion and the orthographic projection of the edge of the cover window adjacent to the tapered portion on the plane comprising the main surface of the display portion is equal to or greater than a second value.

4. The display apparatus of claim 1, wherein a height of the tapered portion, relative to the main surface of the display portion on the first side, gradually increases from an edge of the tapered portion adjacent to the polarizer to a boundary between the tapered portion and the main portion; and
   the orthographic projection of the edge of the cover window on the plane comprising the main surface of the display portion is between the orthographic projection of the edge of the tapered portion adjacent to the polarizer on the plane comprising the main surface of the display portion and an orthographic projection of the boundary between the tapered portion and the main portion on the plane comprising the main surface of the display portion.

5. The display apparatus of claim 1, wherein a second shortest distance between an orthographic projection of an edge of the cover window adjacent to the tapered portion on the plane comprising the main surface of the display portion and the orthographic projection of a boundary between the tapered portion and the main portion on the plane comprising the main surface of the display portion is also equal to or greater than a first value.

6. The display apparatus of claim 1, wherein an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion.

7. A display apparatus, comprising:
   a display panel comprising a display portion, a connecting portion, and a bending portion;
   a polarizer on a first side of the display portion;
   a cover window on the first side of the display portion, and on a side of the polarizer away from the display portion;
   a coating layer comprising a main portion, and a tapered portion extending from the main portion toward the polarizer, wherein the bending portion connects the display portion and the connecting portion, the bending portion is bent so that the connecting portion is facing a second side of the display portion, forming a bending cavity that is surrounded by the bending portion, the second side being opposite to the first side, the coating layer covers a back side of the bending portion opposite to a side directly surrounding the bending cavity;
   an optically clear adhesive layer on the first side of the display portion, and between the polarizer and the cover window, the optically clear adhesive layer attaching the cover window to the polarizer, wherein the optically clear adhesive layer has a first adhering surface at least partially attaching to the cover window, a second adhering surface at least partially attaching to the polarizer, and an edge connecting the first adhering surface and the second adhering surface and adjacent to the tapered portion; and
   wherein an orthographic projection of an edge of the tapered portion adjacent to the polarizer on a plane comprising a main surface of the display portion is between an orthographic projection of an edge of the cover window on the plane comprising the main surface of the display portion and an orthographic projection of an edge of the polarizer on the plane comprising the main surface of the display portion; and
   an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion, or is between the orthographic projection of the edge of the polarizer adjacent to the tapered portion on the plane comprising the main surface of the display portion and the orthographic projection of the edge of the cover window adjacent to the tapered portion on the plane comprising the main surface of the display portion;
   wherein a third shortest distance, between an orthographic projection of the edge connecting the first adhering surface and the second adhering surface on the plane comprising the main surface of the display portion and an orthographic projection of a virtual contour line on the plane comprising the main surface of the display portion, is also equal to or greater than the first value;
   the virtual contour line is on a surface of the tapered portion; and
   a height of the virtual contour line, relative to the main surface of the display portion on the first side, equals to a height of the second adhering surface, relative to the main surface of the display portion on the first side.

8. The display apparatus of claim 3, wherein the second value is equal to a bonding tolerance of the optically clear adhesive layer.

9. The display apparatus of claim 2, wherein the first value is equal to an engineering tolerance of the tapered portion.

10. The display apparatus of claim 1, further comprising a bezel covering the coating layer and on a side of the coating layer away from the bending portion, the bezel connected to the cover window.

11. The display apparatus of claim 1, wherein a fifth shortest distance between the orthographic projection of the edge of the first back film adjacent to the bending portion on the plane comprising the main surface of the display portion and the orthographic projection of the bending line on the plane comprising the main surface of the display portion is equal to or greater than a third value which equals to $\sqrt{a^2+b^2}$;
   a is a bonding tolerance of the first back film; and
   b is a bending tolerance of the bending portion.

12. The display apparatus of claim 1, wherein a sixth shortest distance between the orthographic projection of the edge of the first back film adjacent to the bending portion on the plane comprising the main surface of the display portion and the orthographic projection of the boundary between the fanout region and the bending portion on the plane comprising the main surface of the display portion is equal to or greater than a fourth value which is a composite tolerance calculated based on a bonding tolerance of the first back film and a material tolerance of the first back film.

13. The display apparatus of claim 1, wherein a seventh shortest distance between the orthographic projection of the edge of the first back film adjacent to the bending portion on the plane comprising the main surface of the display portion and the orthographic projection of the edge of the tapered portion adjacent to the polarizer on the plane comprising the main surface of the display portion is equal to or greater than a fifth value which is a sum of a flow tolerance of the coating layer, the bonding tolerance of the first back film, and an overlength of a neutral plane of a structure comprising the bending portion and the coating layer.

14. The display apparatus of claim 1, wherein a distance between the orthographic projection of an edge of the tapered portion adjacent to the polarizer on the plane comprising the main surface of the display portion and the orthographic projection of the boundary between the tapered portion and the main portion on the plane comprising the main surface of the display portion is less than 400 μm.

15. The display apparatus of claim 1, wherein the coating layer covering the back side of the bending portion extends onto the first side of the display portion by a first margin, and extends onto a side of the connecting portion opposite to the display portion by a second margin; and
   the first margin and the second margin are respectively in a range of 150 μm to 250 μm.

16. A display apparatus, comprising:
   a display panel comprising a display portion, a connecting portion, and a bending portion;
   a polarizer on a first side of the display portion;
   a cover window on the first side of the display portion, and on a side of the polarizer away from the display portion;
   a coating layer comprising a main portion, and a tapered portion extending from the main portion toward the polarizer, wherein the bending portion connects the display portion and the connecting portion, the bending portion is bent so that the connecting portion is facing a second side of the display portion, forming a bending cavity that is surrounded by the bending portion, the second side being opposite to the first side, the coating layer covers a back side of the bending portion opposite to a side directly surrounding the bending cavity;
   an optically clear adhesive layer on the first side of the display portion, and between the polarizer and the cover window, the optically clear adhesive layer attaching the cover window to the polarizer, wherein the optically clear adhesive layer has a first adhering surface at least partially attaching to the cover window, a second adhering surface at least partially attaching to the polarizer, and an edge connecting the first adhering surface and the second adhering surface and adjacent to the tapered portion; and
   wherein an orthographic projection of an edge of the tapered portion adjacent to the polarizer on a plane comprising a main surface of the display portion is between an orthographic projection of an edge of the cover window on the plane comprising the main surface of the display portion and an orthographic projection of an edge of the polarizer on the plane comprising the main surface of the display portion; and
   an orthographic projection of the edge connecting the first adhering surface and the second adhering surface on the plane comprising the main surface of the display portion is aligned with the orthographic projection of the edge of the polarizer adjacent to the tapered portion on the plane comprising the main surface of the display portion, or is between the orthographic projection of the edge of the polarizer adjacent to the tapered portion on the plane comprising the main surface of the display portion and the orthographic projection of the edge of the cover window adjacent to the tapered portion on the plane comprising the main surface of the display portion;
   wherein the connecting portion and the display portion are parts of a stacked structure in the display apparatus;
   wherein, on the first side of the display portion, the stacked structure comprises one or more of:
   a polarizer on the display portion;
   an optically clear adhesive layer on a side of the polarizer away from the display portion; and
   a cover window on a side of the optically clear adhesive layer away from the polarizer, wherein the optically clear adhesive layer attaches the cover window to the polarizer;
   wherein, on a second side of the display portion, the stacked structure comprises one or more of:
   a first back film on a back surface of the display portion on the second side;
   a support layer on a side of the first back film away from the display portion;
   a metal plate on a side of the support layer away from the first back film;
   a second back film on a side of the metal plate away from the support layer; and
   the connecting portion on a side of the second back film away from the metal plate.

17. The display apparatus of claim 16, wherein an orthographic projection of an edge of the support layer on the display portion substantially overlaps with an orthographic projection of an edge of the first back film on the display portion; and
   an orthographic projection of the support layer on the display portion covers an orthographic projection of the metal plate on the display portion with a margin.

18. The display apparatus of claim 16, further comprising:
   a second optically clear adhesive layer between the first back film and the support layer, the second optically clear adhesive layer adhering the first back film and the support layer together; and an adhesive layer between the metal plate and the second back film, the adhesive layer adhering the metal plate and the second back film together.

19. The display apparatus of claim 16, further comprising:

an adhesive layer between the metal plate and the second back film, the adhesive layer adhering the metal plate and the second back film together;

an ultra thin glass on a side of the cover window away from the display portion;

a second optically clear adhesive layer between the ultra thin glass and the cover window, the second optically clear adhesive layer adhering the ultra thin glass and the cover window together;

a second cover window on a side of the ultra thin glass away from the cover window; and a third optically clear adhesive layer between the ultra thin glass and the second cover window, the third optically clear adhesive layer adhering the ultra thin glass and the second cover window together.

* * * * *